United States Patent
Lee et al.

(10) Patent No.: US 12,386,545 B2
(45) Date of Patent: Aug. 12, 2025

(54) MEMORY DEVICE FOR REDUCING TIMING PARAMETERS AND POWER CONSUMPTION FOR INTERNAL PROCESSING OPERATION AND METHOD OF IMPLEMENTING THE SAME

(71) Applicant: Samsung Electronics Co., Ltd., Suwon-si (KR)

(72) Inventors: Sukhan Lee, Seoul (KR); Shinhaeng Kang, Suwon-si (KR); Kyomin Sohn, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 17/879,523

(22) Filed: Aug. 2, 2022

(65) Prior Publication Data

US 2023/0094148 A1     Mar. 30, 2023

(30) Foreign Application Priority Data

Sep. 24, 2021     (KR) .................. 10-2021-0126723

(51) Int. Cl.
*G06F 3/06* (2006.01)

(52) U.S. Cl.
CPC .......... *G06F 3/0655* (2013.01); *G06F 3/0604* (2013.01); *G06F 3/0673* (2013.01)

(58) Field of Classification Search
None
See application file for complete search history.

(56) References Cited

U.S. PATENT DOCUMENTS

| | | |
|---|---|---|
| 5,701,267 A | 12/1997 | Masuda et al. |
| 10,553,260 B2 | 2/2020 | Shin et al. |
| 10,592,467 B2 | 3/2020 | Ryu et al. |
| 10,877,835 B2 | 12/2020 | Wang et al. |
| 2003/0117924 A1 | 6/2003 | Shiraishi et al. |
| 2011/0093662 A1* | 4/2011 | Walker .................. G06F 3/0683 711/147 |

(Continued)

FOREIGN PATENT DOCUMENTS

| | | |
|---|---|---|
| KR | 20170136055 A | 12/2017 |
| KR | 10-2019-0036358 A | 4/2019 |
| KR | 20210043216 A | 4/2021 |

OTHER PUBLICATIONS

European Communication pursuant to Article 94(3) EPC dated Jul. 16, 2024 for corresponding European Application No. 22196315.0.

(Continued)

*Primary Examiner* — Tracy C Chan
(74) *Attorney, Agent, or Firm* — Harness, Dickey & Pierce, P.L.C.

(57) ABSTRACT

A memory device for reducing timing parameters and power consumption for an internal processing operation and a method of implementing the same are provided. The memory device includes a memory cell array, a processing-in-memory (PIM) circuit configured to perform a processing operation and a control logic circuit configured to control a normal mode and an internal processing mode. The control logic circuit writes an operation result obtained by the processing operation of the PIM circuit in the internal processing mode in the memory cell array and provides read data read from the memory cell array to the PIM circuit.

13 Claims, 13 Drawing Sheets

(56) References Cited

U.S. PATENT DOCUMENTS

| | | | |
|---|---|---|---|
| 2016/0231949 A1* | 8/2016 | Chang | G06F 13/1631 |
| 2017/0255390 A1 | 9/2017 | Chang et al. | |
| 2017/0344301 A1* | 11/2017 | Ryu | G06F 15/785 |
| 2018/0053545 A1* | 2/2018 | Son | G11C 7/08 |
| 2018/0107406 A1* | 4/2018 | O | G06F 3/0611 |
| 2019/0065115 A1* | 2/2019 | Kwon | G06F 3/0673 |
| 2020/0035291 A1* | 1/2020 | Kasibhatla | G11C 11/4087 |
| 2020/0294558 A1* | 9/2020 | Yu | G11C 5/063 |
| 2021/0110876 A1 | 4/2021 | Seo et al. | |
| 2021/0343325 A1* | 11/2021 | Moon | G11C 11/4076 |
| 2022/0068366 A1 | 3/2022 | Kwon et al. | |
| 2022/0076769 A1* | 3/2022 | Park | G11C 7/222 |

OTHER PUBLICATIONS

Zambelli Cristian et al., "Phase Change and Magnetic Memories for Solid-State Drive Applications", Proceedings of the IEEE, vol. 105, No. 9, Sep. 1, 2017, pp. 1790-1811, XP093184343.

Partial European Search Report dated Jan. 26, 2023 for corresponding European Application No. 22196315.0.

"JEDEC Standard Low Power Double Data Rate 4 (LPDDR4)", *JEDEC Solid State Technology Association*, Aug. 2014, JEDEC Standard No. 209-4, pp. 1-196.

Office Action for Korean Application No. 10-2021-0126723 dated May 14, 2025.

* cited by examiner

MEMORY DEVICE FOR REDUCING TIMING PARAMETERS AND POWER CONSUMPTION FOR INTERNAL PROCESSING OPERATION AND METHOD OF IMPLEMENTING THE SAME

CROSS-REFERENCE TO RELATED APPLICATION

This application is based on and claims priority under 35 U.S.C. § 119 to Korean Patent Application No. 10-2021-0126723, filed on Sep. 24, 2021, in the Korean Intellectual Property Office, the disclosure of which is incorporated by reference herein in its entirety.

BACKGROUND

The inventive concepts relate to apparatuses and methods, and more particularly, to a memory device for reducing timing parameters and power consumption for an internal processing operation and a method of implementing the same.

Applications such as high performance and/or graphics algorithms are data and computer-intensive. Applications such as deep neural networks can require a computing system with massive computational and memory capabilities to train or learn other data sets more accurately. A processing-in-memory (PIM) type memory device may perform some of computation operations of the computing system in internal processing. The computation operations of the computing system may be reduced through a PIM processing operation of the memory device.

The PIM processing operation may be performed regardless of signals, timing, driving, and/or operational parameters and functionality required or desired for efficient communication between a memory controller and the memory device. Because the PIM processing operation is performed using data read from a memory cell array, the timing parameters and functionality of an interface operation and/or a memory operation related to outputting the data read from the memory cell array to the memory controller are not important. In addition, because a result of the PIM processing operation is written in the memory cell array, parameters and functionality of an interface operation and/or a memory operation related to receiving written data from the memory controller and storing the received data in the memory cell array are also not important.

When the timing parameters supporting the interface operation and/or the memory operation are strictly required for the PIM processing operation, unnecessary operations and penalties of delay time may occur. In addition, power consumption may occur by toggling of internal signals related to the interface operation and/or the memory operation and/or operations of internal circuits. The delay time and power consumption of the PIM processing operation of the memory device have a significant effect on process efficiency and power consumption of the computing system.

SUMMARY

The inventive concepts relate to a memory device for reducing timing parameters and power consumption for a processing-in-memory (PIM) processing operation and a method of implementing the same.

According to an aspect of the inventive concepts, there is provided a memory device including a memory cell array including a plurality of memory cells, a PIM circuit configured to perform a processing operation, and a control logic circuit configured to, in response to a write command in a normal mode received from the memory controller to the memory device, control the memory device to perform a write operation for write data provided by a memory controller, in response to a write command in an internal processing mode received from the memory controller to the memory device, control the memory device to perform a write operation for an operation result obtained by the processing operation, and control the memory device so that a first time for a write operation in the internal processing mode being performed is less than a second time for a write operation in the normal mode being performed.

According to an aspect of the inventive concepts, there is provided a memory device including a memory cell array including a plurality of memory cells, a PIM circuit configured to perform a processing operation, and a control logic circuit configured to, in response to a read command in a normal mode received from the memory controller to the memory device, control the memory device to provide read data read from the memory cell array and a toggling read data strobe signal to the memory controller in response to a read command in an internal processing mode received from the memory controller to the memory device, provide the read data to the PIM circuit, and control the memory device so that the read data and the read data strobe signal are not provided to the memory controller in response to the read command in the internal processing mode.

According to an aspect of the inventive concepts, there is provided a memory device including at least one logic die, a plurality of memory dies stacked on the at least one logic die, and through silicon vias (TSV) configuring buses electrically connecting the at least one logic die to the plurality of memory dies. Each of the plurality of memory dies includes a memory cell array including a plurality of memory cells, a PIM circuit configured to perform a processing operation, and a control logic circuit configured to, in response to a write command in a normal mode received from the memory controller to the memory device, control each of the plurality of memory dies to perform a write operation for write data provided by the memory controller, in response to a write command in an internal processing mode received from the memory controller to each of the plurality of memory dies, control each of the plurality of memory dies to perform a write operation for an operation result obtained by the processing operation, and control the memory device so that a first time for a write operation in the internal processing mode being performed is less than a second time for a write operation in the normal mode being performed.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EXAMPLE EMBODIMENTS

Figure 1:
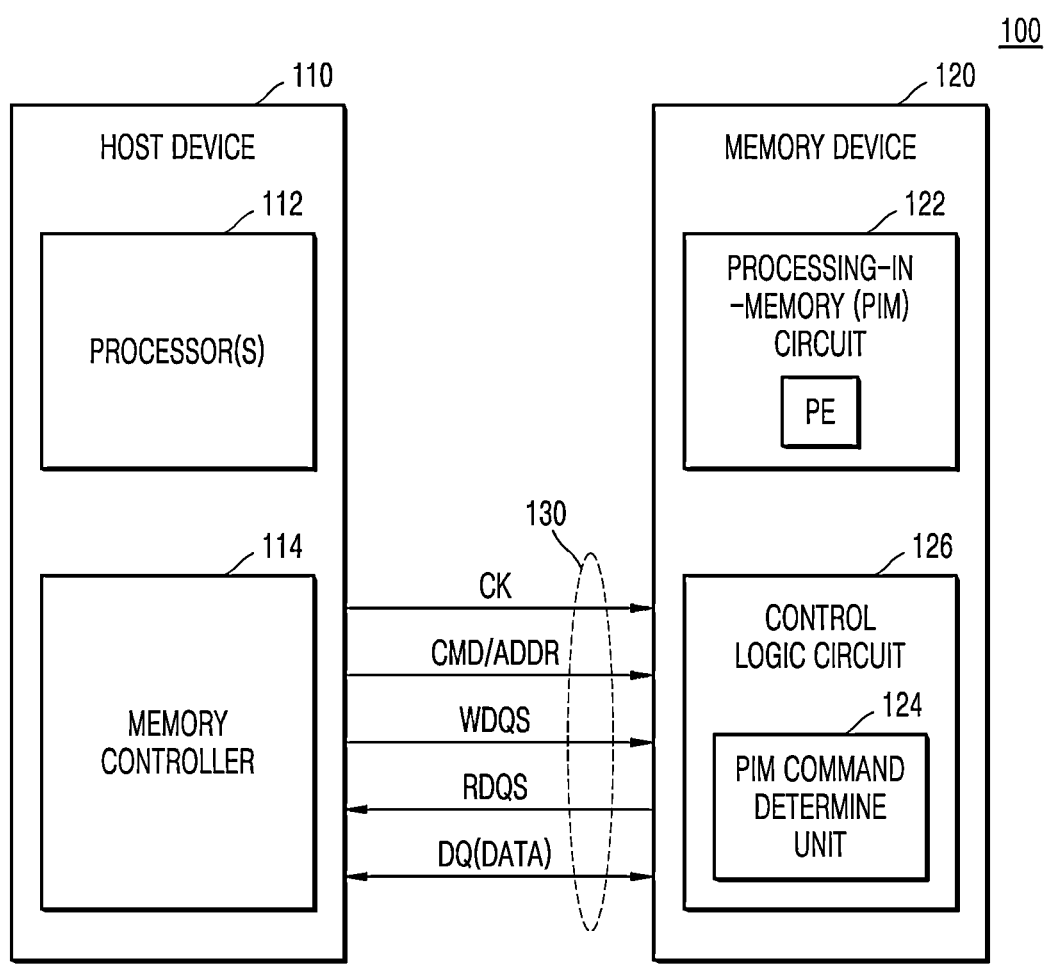
FIG. 1 is a view illustrating a system including a memory device performing an internal processing operation according to an example embodiment of the inventive concepts.

FIG. 1 is a view illustrating a system 100 including a memory device performing an internal processing operation according to an example embodiment of the inventive concepts.

Referring to FIG. 1, the system 100 may execute applications such as learning systems including deep neural networks or applications including a high-performance computing operation or a graphics operation. These applications require many operations and high memory capabilities. Power efficiency and low latency may be important in these applications in order to cooperatively perform jobs or tasks in a parallel manner, to train other data sets, and to learn the other data sets with high accuracy.

The system 100 may include a host device 110 and a memory device 120. The host device 110 are used for performing an entire job or task by using a parallel processing approach in which the entire job or task is divided into smaller jobs performed in parallel by a large number of computing entities (for example, processors, cores in the processors, and a processing-in-memory (PIM) circuit 122). The task may include a plurality of jobs with a hierarchy. Each job may refer to executable code to be executed by a computing entity, data to be processed, data detected by the memory device 120 in accordance with the computing entity, data manipulated by executing the code, and data to be stored.

The host device 110 may be communicatively connected to the memory device 120 through a bus 130. The host device 110 may be a computing system such as a computer, a laptop computer, a server, a workstation, a portable communication terminal, a personal digital assistant (PDA), a portable multimedia player (PMP), a smartphone, or a wearable device. Alternatively, the host device 110 may be a part of components included in the computing system such as a graphics card.

The host device 110 may include processor(s) 112 performing a common computing operation in the system 100 and a memory controller 114 managing data transmission and reception to/from the memory device 120. The processor(s) 112 as a primary component of the system 100 processing and managing commands mainly execute an operating system (OS) and the applications. In addition, the processor(s) 112 may distribute complicated jobs or tasks to a plurality of computing entities so that job load is processed in parallel. The processor(s) 112 may include a processing unit such as a central processing unit (CPU), a digital signal processor (DSP), a graphics processing unit (GPU), an encryption processing unit, a physics processing unit, or a machine learning processing unit.

The processor(s) 112 may increase efficiency by distributing or offloading execution of various arithmetic operations, commands, or kernels to another processor or on the memory device 120. The kernel is defined as one or more commands grouped together to perform a task or a definable sub-task. An example, in which the PIM circuit 122 of the memory device 120 performs operation processing by the kernel offloaded by the processor(s) 112, will be described. Various kinds of operation processing may be performed by the PIM circuit 122. For example, in relation to artificial intelligence (AI), at least some of neural network operations may be performed by the PIM circuit 122. For example, the processor(s) 112 may control the memory device 120 through the memory controller 114 so that at least some of the neural network operations may be performed by the PIM circuit 122.

The memory controller 114 may access the memory device 120 in accordance with a memory request of the host device 110. The memory controller 114 may control a write operation or a read operation for the memory device 120 by providing a command CMD and an address ADDR to the memory device 120. In addition, data DQ for the write operation and the read data DQ may be transmitted and received between the memory controller 114 and the memory device 120. Such a memory access operation may be performed through the bus 130 between the memory controller 114 and the memory device 120.

The bus 130 may include clock signal lines transmitting a main clock signal CK, a write data strobe signal WDQS, and a read data strobe signal RDQS, command/address signal lines transmitting the command/address CMD/ADDR, and data lines transmitting the data DQ. For convenience, it is illustrated that the clock signal lines, the command/address signal lines, and the data lines are respectively connected between the memory controller 114 and the memory device 120 through one signal line. However, the clock signal lines, the command/address signal lines, and the data lines may be respectively connected between the memory controller 114 and the memory device 120 through a plurality of signal lines.

The memory device 120 may write or read data in accordance with control by the memory controller 114. Exemplarily, the memory device 120 may be a double data rate synchronous dynamic random access memory (DDR SDRAM) device. However, the inventive concepts are not limited thereto, and the memory device 120 may be one of volatile memory devices such as low power double data rate (LPDDR) SDRAM, wide I/O DRAM, high bandwidth memory (HBM), and a hybrid memory cube (HMC). According to an example embodiment, the memory device 120 may be one of non-volatile memory devices such as flash memory, phase-change RAM (PRAM), magnetic RAM (MRAM), resistive RAM (RRAM), and ferroelectric RAM (FRAM).

The memory device 120 may operate in any one of a normal mode and an internal processing mode. The normal mode refers to an operation mode in which a general data transaction operation is performed in accordance with the control by the memory controller 114, and the internal processing mode refers to an operation mode in which an internal processing operation is performed in accordance with the control by the memory controller 114. In the data transaction operation, the memory device 120 may perform a command and address reception operation and a data exchange operation in accordance with normal mode timing parameters predetermined in DDR and/or LPDDR protocols by the control by the memory controller 114. In the internal processing operation, the memory device 120 may perform the command and address reception operation and the data exchange operation in accordance with internal processing mode timing parameters predetermined in the DDR and/or LPDDR protocols by the control by the memory controller 114. The normal mode timing parameters and the internal processing mode timing parameters may be set differently. According to an example embodiment, the internal processing mode timing parameters may be set to have values less than those of the normal mode timing parameters.

The memory device 120 may include the PIM circuit 122 and a control logic circuit 126. The PIM circuit 122 may include one or more processing elements PEs configured to execute the kernel offloaded by the host device 110. The PIM circuit 122 is hardware having a processing function like the processor(s) 112 included in the host device 110. When the PIM circuit 122 is referred to as an internal processor, the term "internal" means that the PIM circuit 122 is provided in the memory device 120. Therefore, a processor provided "outside" the memory device 120 may refer to, for example, the processor(s) 112 of the host device 110.

The control logic circuit 126 may control overall operations of the memory device 120 and may include a PIM command determination unit 124. The PIM command determination unit 124 may determine whether the command CMD applied to the memory device 120 is a normal command specifying the normal mode or a PIM command specifying the internal processing mode. When the received command is a normal command, the memory device 120 may perform the data transaction operation in the normal mode by control by the control logic circuit 126. When the received command is a PIM command, the memory device 120 may perform the internal processing operation in the internal processing mode by the control by the control logic circuit 126.

The control logic circuit 126 may perform control by setting an operating condition for latency related to the write data or the read data in the normal mode of the memory device 120 to be different from an operating condition for latency related to the write data or the read data in the internal processing mode of the memory device 120. The control logic circuit 126 may control an operating condition of a write data strobe signal WDQS related to the write data set in the normal mode as non-setting so that write data strobe signal WDQS related to the write data does not toggle in the internal processing mode. The control logic circuit 126 may control an operating condition of the read data strobe signal RDQS related to the read data set in the normal mode as non-setting so that the read data strobe signal RDQS related to the read data does not toggle in the internal processing mode.

The control logic circuit 126 may perform control by setting a timing parameter related to the read command or the write command in the normal mode of the memory device 120 to be different from a timing parameter related to the read command or the write command in the internal processing mode of the memory device 120. The control logic circuit 126 may perform control by setting a first timing parameter (for example, a write-to-read delay (tWTR) parameter) as the operation condition for the read command received after the write operation based on the write command and by setting a first timing parameter in the internal processing mode to be shorter than that in the normal mode. The control logic circuit 126 may perform control by setting a second timing parameter (for example, a read-to-write delay (tRTW) parameter) as the operating condition for the write command received after the read operation based on the read command and by setting a second timing parameter in the internal processing mode to be shorter than that in the normal mode.

Figure 2:
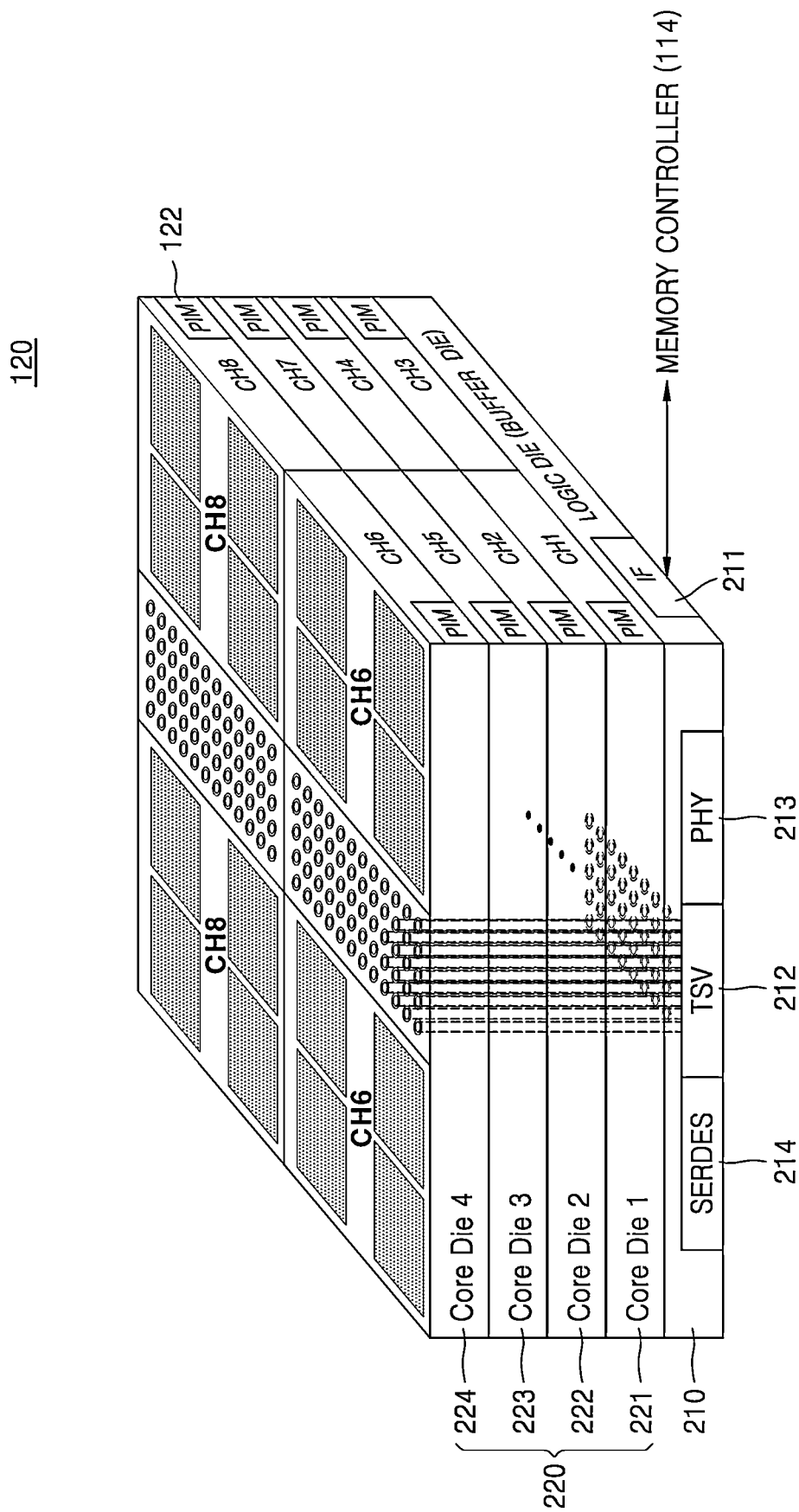
FIG. 2 is a view illustrating a memory device according to an example embodiment of the inventive concepts.

FIG. 2 is a view illustrating a memory device according to an example embodiment of the inventive concepts. FIG. 2 illustrates the memory device 120 of FIG. 1 implemented by HBM. The HBM configuration illustrated in FIG. 2 is provided as an example and is not necessarily a real HBM configuration. In addition, the HBM configuration illustrated in FIG. 2 as an example does not represent or imply restrictions on the current disclosure. In the following example embodiments, terms "memory device 120" and "HBM 120" may be used interchangeably for convenience.

Referring to FIGS. 1 and 2, the HBM 120 may be connected to the host device 110 through the HBM protocol of the JEDEC (Joint Electron Device Engineering Council) standard. The HBM protocol is a high-performance RAM interface for three-dimensional stacked memory (for example, DRAM). The HBM 120 consumes a smaller amount of power and has a higher bandwidth in a smaller form factor than other DRAM technologies (for example, DDR4 and GDDR5).

The HBM 120 may have a high bandwidth by including first to eighth channels CH1 to CH8 having interfaces independent from one another. The HBM 120 may include a plurality of dies, for example, a logic die (or a buffer die 210) and one or more core dies 220 stacked on the logic die 210. In the example of FIG. 2, it is illustrated that first to fourth core dies 221 to 224 are included in the HBM 120. However, the number of core dies 220 may vary. The core dies 220 may be referred to as memory dies.

Each of the first to fourth core dies 221 to 224 may include one or more channels. In FIG. 2, an example, in which each of the first to fourth core dies 221 to 224 includes two channels so that the HBM 120 includes the first to eighth channels CH1 to CH8, is illustrated. For example, the first core die 221 may include the first and third channels CH1 and CH3, the second core die 222 may include the second and fourth channels CH2 and CH4, the third core die 223 may include the fifth and seventh channels CH5 and CH7, and the fourth core die 224 may include the sixth and eighth channels CH6 and CH8.

The logic die 210 may include an interface circuit 211 communicating with the host device 110 and may receive a command/an address and data from the host device 110 through the interface circuit 211. The host device 110 may transmit the command/the address and the data through the bus(es) 130 arranged to respectively correspond to the first to eighth channels CH1 to CH8 and may be formed so that the bus(es) 130 are divided by channel or some buses 130 are shared by at least two channels. The interface circuit 211 may transmit the command/the address and the data to a channel requested by the host device 110 to perform a memory operation or the operation processing. In addition, according to an example embodiment of the inventive concepts, each of the core dies 220 or each of the first to eighth channels CH1 to CH8 may include the PIM circuit 122.

The host device 110 may provide the command/the address and the data so that at least some of a plurality of arithmetic operations or kernels may be performed by the HBM 120 and the operation processing may be performed by the PIM circuit 122 of a channel designated by the host device 110. For example, when the received command/address instructs a channel to perform the operation processing, the PIM circuit 122 of the corresponding channel may perform the operation processing by using the data read from the corresponding channel and may write-back the operation processing result to the corresponding channel. In another example, when the command/address received by the corresponding channel of the HBM 120 instructs the corresponding channel to perform the memory operation, a data access operation may be performed.

According to an example embodiment, each of the first to eighth channels CH1 to CH8 may include a plurality of banks and the PIM circuit 122 of each of the first to eighth channels CH1 to CH8 may include one or more processing elements. For example, in each of the first to eighth channels CH1 to CH8, the number of processing elements may be equal to the number of banks or may be less than the number of banks so that one processing element may be shared by at least two banks. The PIM circuit 122 of each of the first to eighth channels CH1 to CH8 may execute the kernel offloaded by the host device 110.

On the other hand, the logic die 210 may further include a through silicon via (TSV) area 212, an HBM physical layer interface (HBM PHY) area 213, and a serializer/deserializer (SERDES) area 214. In the TSV area 212, TSVs for communication with the core dies 220 are formed and the bus(es) 130 arranged to correspond to the first to eighth channels CH1 to CH8 are formed. When each of the first to eighth channels CH1 to CH8 has a bandwidth of 128 bits, the TSVs may include configurations for inputting and outputting data of 1,024 bits.

The HBM PHY area 213 may include a plurality of input and output circuits for communication with the memory controller 114 and the first to eighth channels CH1 to CH8. For example, the HBM PHY area 213 may include one or more interconnect circuits for connecting the memory controller 114 to the first to eighth channels CH1 to CH8. The HBM PHY area 213 may include a physical or electrical layer and a logical layer provided for signals, a frequency, timing, driving, a detailed operation parameter, and functionality required for efficient communication between the memory controller 114 to the first to eighth channels CH1 to CH8. The HBM PHY area 213 may perform memory interfacing such as selecting a row and a column corresponding to a memory cell, writing data in the memory cell, or reading the written data. The HBM PHY area 213 may support characteristics of the HBM protocol of the JEDEC standard.

The SERDES area 214 provides an SERDES interface of the JEDEC standard as a processing throughput of the processor(s) 112 of the host device 110 and demands on a memory bandwidth increase. The SERDES area 214 may include an SERDES transmitter unit, an SERDES receiver unit, and a controller unit. The SERDES transmitter unit may include a parallel-to-serial circuit and a transmitter, may receive a parallel data stream, and may serialize the received parallel data stream. The SERDES receiver unit may include a receiver amplifier, an equalizer, a clock and data recovery circuit, and a serial-to-parallel circuit, may receive a serial data stream, and may parallelize the received serial data stream. The controller unit may include registers such as an error detection circuit, an error correction circuit, and a first-in-first-out (FIFO).

Figure 3:
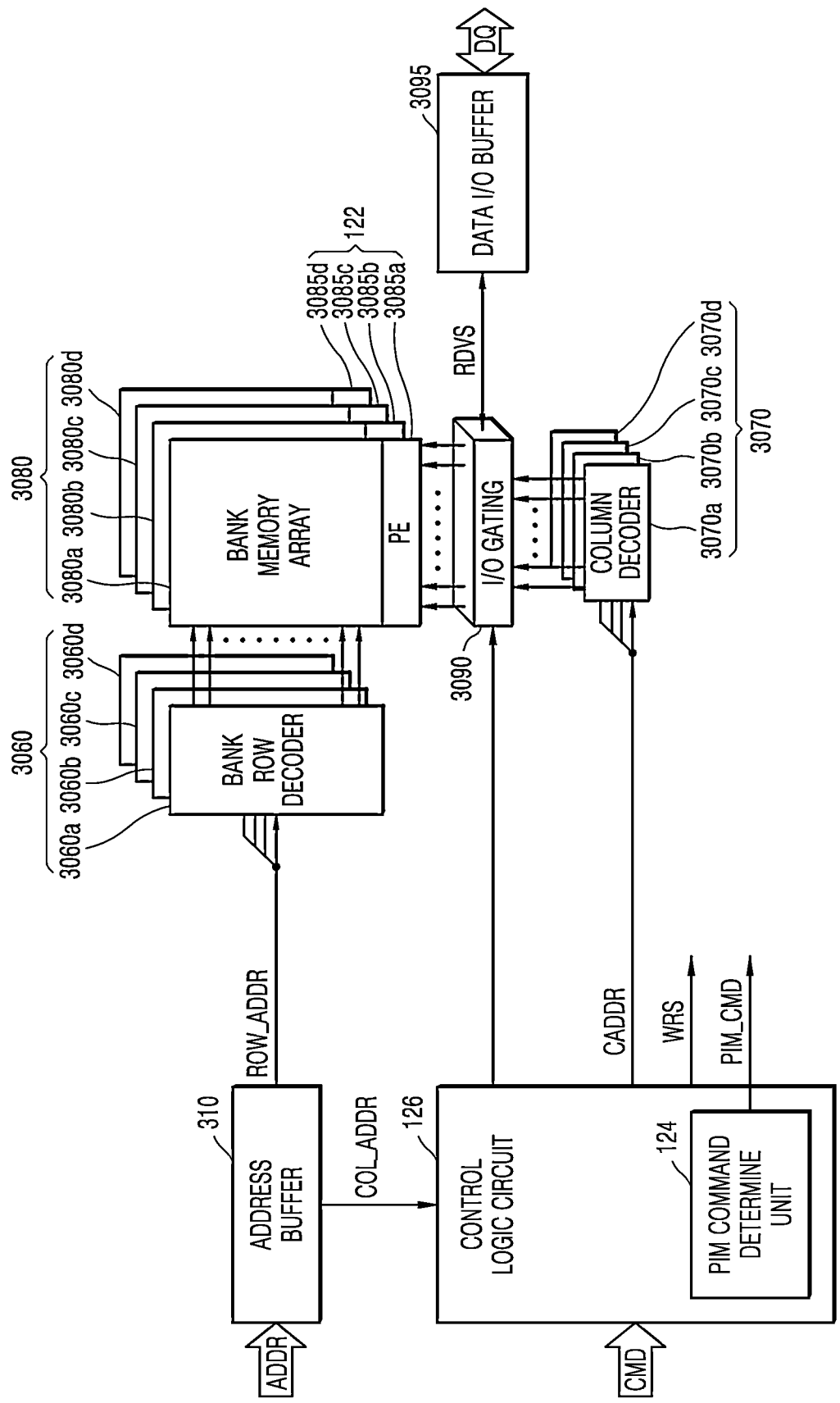
FIG. 3 is a block diagram illustrating a configuration of a memory device according to an example embodiment of the inventive concepts.

FIG. 3 is a block diagram illustrating a configuration of a memory device according to an example embodiment of the inventive concepts. FIG. 3 representatively illustrates a configuration of the first channel CH1 among the first to eighth channels CH1 to CH8 in the HBM of FIG. 2. The configuration of the first channel CH1 may also be applied to each of the second to eighth channels CH2 to CH8. In addition, the configuration of the first channel CH1 may also be applied to the memory device 120 (refer to FIG. 1) implemented by stand-alone-type DDR and/or LPDDR DRAM.

Referring to FIG. 3, the first channel CH1 may include an address buffer 310, a control logic circuit 126, a PIM circuit 122, a row decoder 3060, a column decoder 3070, a memory cell array 3080, an input/output gating circuit 3090, and a data input/output buffer 3095. Although not shown in FIG. 3, the first channel CH1 may further include a clock buffer, a command decoder, a mode register, a refresh control circuit, a voltage generating circuit, and a bank control logic.

The memory cell array 3080 may include first to fourth bank arrays 3080a, 3080b, 3080c, and 3080d. Each of the first to fourth bank arrays 3080a, 3080b, 3080c, and 3080d may include a plurality of word lines and a plurality of bit lines and a plurality of memory cells formed at intersections between the plurality of word lines and the plurality of bit lines.

The row decoder 3060 may include first to fourth bank row decoders 3060a, 3060b, 3060c, and 3060d respectively connected to the first to fourth bank arrays 3080a, 3080b, 3080c, and 3080d. The column decoder 3070 may include first to fourth bank column decoders 3070a, 3070b, 3070c, and 3070d respectively connected to the first to fourth bank arrays 3080a, 3080b, 3080c, and 3080d. The PIM circuit 122 may include first to fourth processing elements 3085a, 3085b, 3085c, and 3085d respectively connected to the first to fourth bank arrays 3080a, 3080b, 3080c, and 3080d.

The first to fourth bank arrays 3080a, 3080b, 3080c, and 3080d, the first to fourth bank row decoders 3060a, 3060b, 3060c, and 3060d, the first to fourth bank column decoders 3070a, 3070b, 3070c, and 3070d, and the first to fourth processing elements 3085a, 3085b, 3085c, and 3085d may respectively configure first to fourth memory banks. In the current example embodiment, an example of the first channel CH1 including four memory banks is illustrated. However, in various example embodiments, the first channel CH1 may include any number of memory banks.

The control logic circuit 126 may control overall operations of the first channel CH1. The control logic circuit 126 may generate control signals so that the first channel CH1 may perform a write operation, a read operation, and/or a refresh operation. The control logic circuit 126 may include a command decoder for decoding the command CMD received from the memory controller 114 and a mode register for setting a plurality of operation options of the first channel CH1. The mode register may be used for controlling, for example, a burst length, read/write latency, preamble/postamble lengths, pre-emphasis, and reference voltage setting. The burst length may be provided to set the maximum number of column locations that may be accessed for read and/or write commands The read/write latency may be provided to define a clock cycle delay between the read and/or write commands and a first bit of valid output and/or input data.

The address buffer 310 may receive the address ADDR including a row address ROW_ADDR and a column address COL_ADDR from the memory controller 114. In addition, the address buffer 310 may receive a bank address and may provide the received bank address to the bank control logic, may provide the received row address ROW_ADDR to the row decoder 3060, and may provide the received column address COL_ADDR to the control logic circuit 126. The bank control logic may generate bank control signals in response to the bank address. In response to the bank control signals, among the first to fourth bank row decoders 3060a, 3060b, 3060c, and 3060d, a bank row decoder corresponding to the bank address may be activated and, among the first to fourth bank column decoders 3070a, 3070b, 3070c, and 3070d, a bank column decoder corresponding to the bank address may be activated.

The input/output gating circuit 3090 may include a column selection circuit, an input data mask logic, read data latches for storing read data output from the first to fourth bank arrays 3080a, 3080b, 3080c, and 3080d, and a write driver for writing data in the first to fourth bank arrays 3080a, 3080b, 3080c, and 3080d together with circuits for gating input and output data DQ.

The read data output from one of the first to fourth bank arrays 3080a, 3080b, 3080c, and 3080d may be sensed by sense amplifiers corresponding to the one bank array and may be stored in the read data latches. The write data to be written in a memory cell array of one of the first to fourth bank arrays 3080a, 3080b, 3080c, and 3080d may be provided from the memory controller 114 to the data input/output buffer 3095. The data provided to the data input/output buffer 3095 may be written in one bank array through the write driver.

The control logic circuit 126 may include the PIM command determination unit 124 receiving the command CMD from the memory controller 114 and determining whether the received command CMD is a normal command designating the normal mode or a PIM command designating the internal processing mode. The PIM command determination unit 124 may provide a PIM command signal PIM_CMD when it is determined that the received command is the PIM command As an example, when it is determined that the received command is a PIM command, the PIM command determination unit 124 may activate the PIM command signal PIM_CMD. The control logic circuit 126 may control the first channel CH1 to perform the internal processing operation in the internal processing mode in response to the activated PIM command signal PIM_CMD. When it is determined that the received command is a normal command, the PIM command determination unit 124 may deactivate the PIM command signal PIM_CMD. The control logic circuit 126 may control the first channel CH1 to perform the data transaction operation in the normal mode in response to the deactivated PIM command signal PIM_CMD.

The control logic circuit 126 may receive a bank address and a column address with the write command CMD in the normal mode and the write data synchronized with the write data strobe signal WDQS (refer to FIG. 10A) toggling after the write latency WL(refer to FIG. 10A) and may write the received bank and column addresses and write data in the memory cell array 3080. The control logic circuit 126 may receive the bank address and the column address with the write command CMD in the internal processing mode and may write the result of the processing operation performed by the processing element PE of the PIM circuit 122 in the memory cell array 3080. In the internal processing mode, because the write data is not received from the memory controller 114, the pair of write data strobe signals WDQS_T and WDQS_C (refer to FIG. 10B) related to the write data are non-set not to toggle and the tWTR parameter (refer to FIG. 10B) defined in the normal mode may be reduced.

Figure 11A:
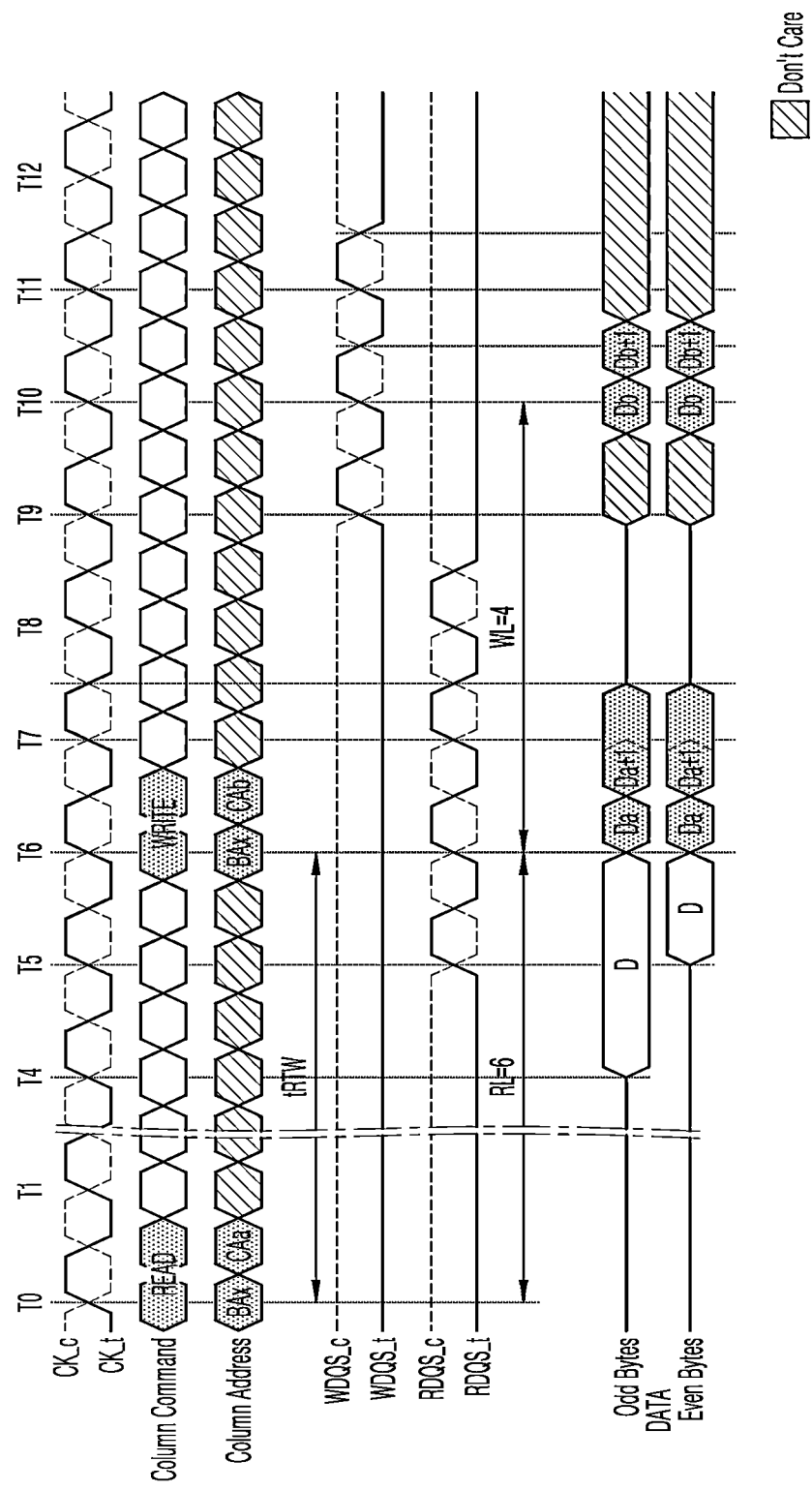
FIGS. 11A and 11B are timing diagrams each illustrating a read operation of a memory device according to an example embodiment of the inventive concepts.

The control logic circuit 126 may receive the bank address and the column address with the read command CMD in the normal mode and may output the read data from the memory cell array 3080 corresponding to the bank and column addresses to output the read data synchronized with the read data strobe signal RDQS after the read latency RL (refer to FIG. 11A). The control logic circuit 126 may receive the bank address and the column address with the read command CMD in the internal processing mode and may use the data read from the memory cell array 3080 corresponding to the bank and column address for the processing operation performed by the processing element PE of the PIM circuit 122. In the internal processing mode, because the read data of the memory cell array 3080 is not transmitted to the memory controller 114, the read latency RL (refer to FIG. 11B) and the pair of read data strobe signals RDQS_t and RDQS_c are non-set so as not to toggle and the tRTW parameter (refer to FIG. 11B) specified in the normal mode may be reduced.

The control logic circuit 126 may generate an internal column address CADDR, an internal write signal WRS, and an internal read signal RDVS in response to the PIM command signal PIM_CMD. The internal column address CADDR, the internal write signal WRS, and the internal read signal RDVS may operate as main signals having the write operation and the read operation performed and may be provided to the input/output gating circuit 3090 including the column selection circuit and an input/output data gating circuit.

The column selection circuit may select a predetermined pair of bit lines from a plurality of pairs of bit lines of a selected bank array and may connect the selected pair of bit lines to a data input/output line through a pair of global data lines. The data input/output line is a finish line on an operation of reading or writing data of a memory cell. The data of the memory cell loaded on the data input/output line may determine an operation speed of the first channel CHE Such a speed is determined by time spent on sensing an amount of data stored in the memory cell to be read and outputting the sensed amount to the data input/output line or time spent on transmitting data to be written from the data input/output line to the memory cell. Therefore, it is necessary or desired to reduce load on the data input/output line in order to prevent the operating speed from being reduced.

Because the data input/output line is connected to the column selection circuit operated by the internal column address CADDR and the input/output data gating circuit operated by the internal write signal WRS and the internal read signal RDVS, in order to increase the operating speed of the first channel CH1, creation time of the internal column address CADDR may be advanced. In addition, the control logic circuit 126 may disable the input/output data gating circuit by deactivating the internal write signal WRS and the internal read signal RDVS in response to the PIM command signal PIM_CMD in the internal processing mode.

Figure 4:
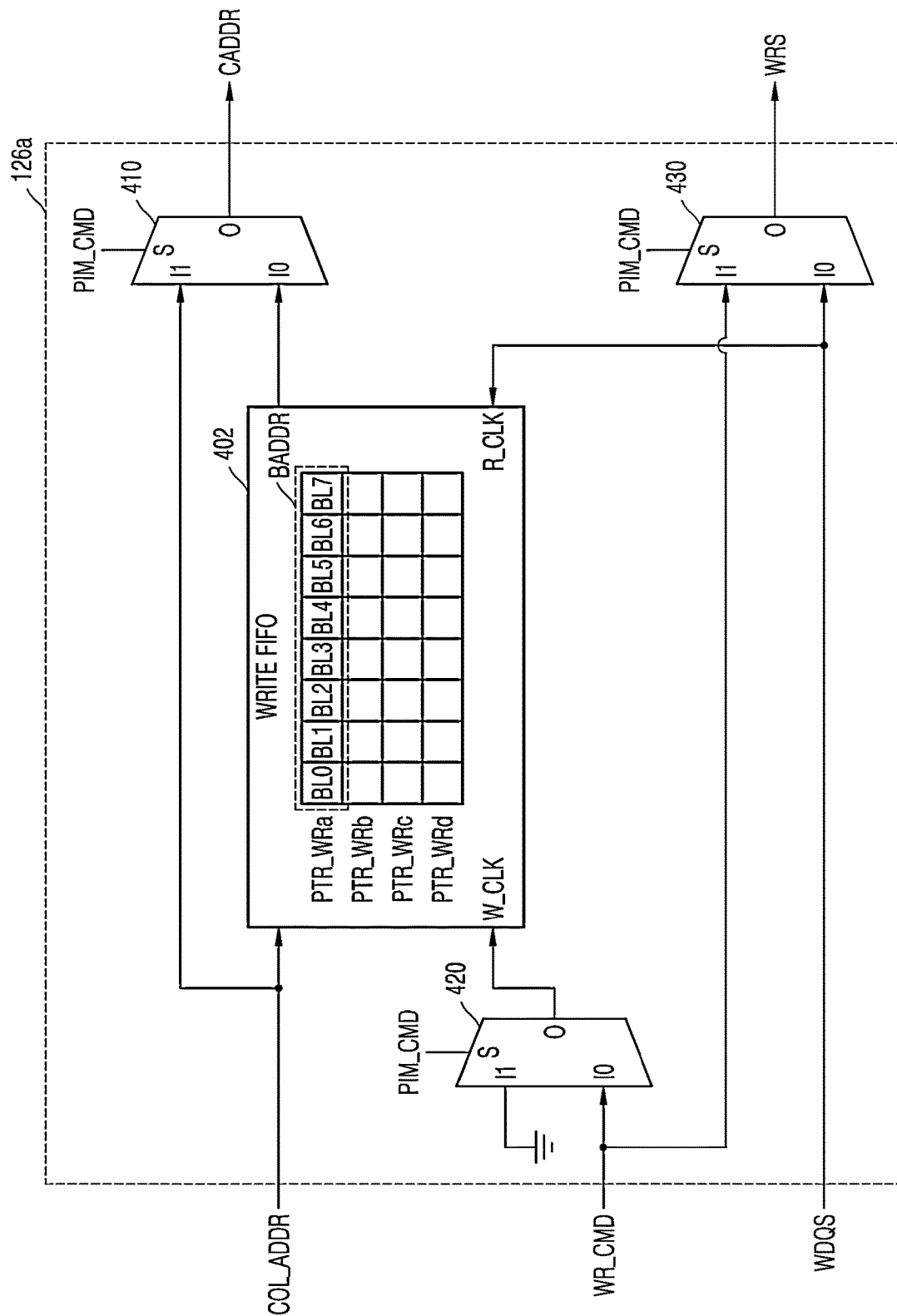
FIGS. 4 and 5 are views each illustrating a control logic circuit controlling an internal processing operation according to an example embodiment of the inventive concepts.
Figure 5:
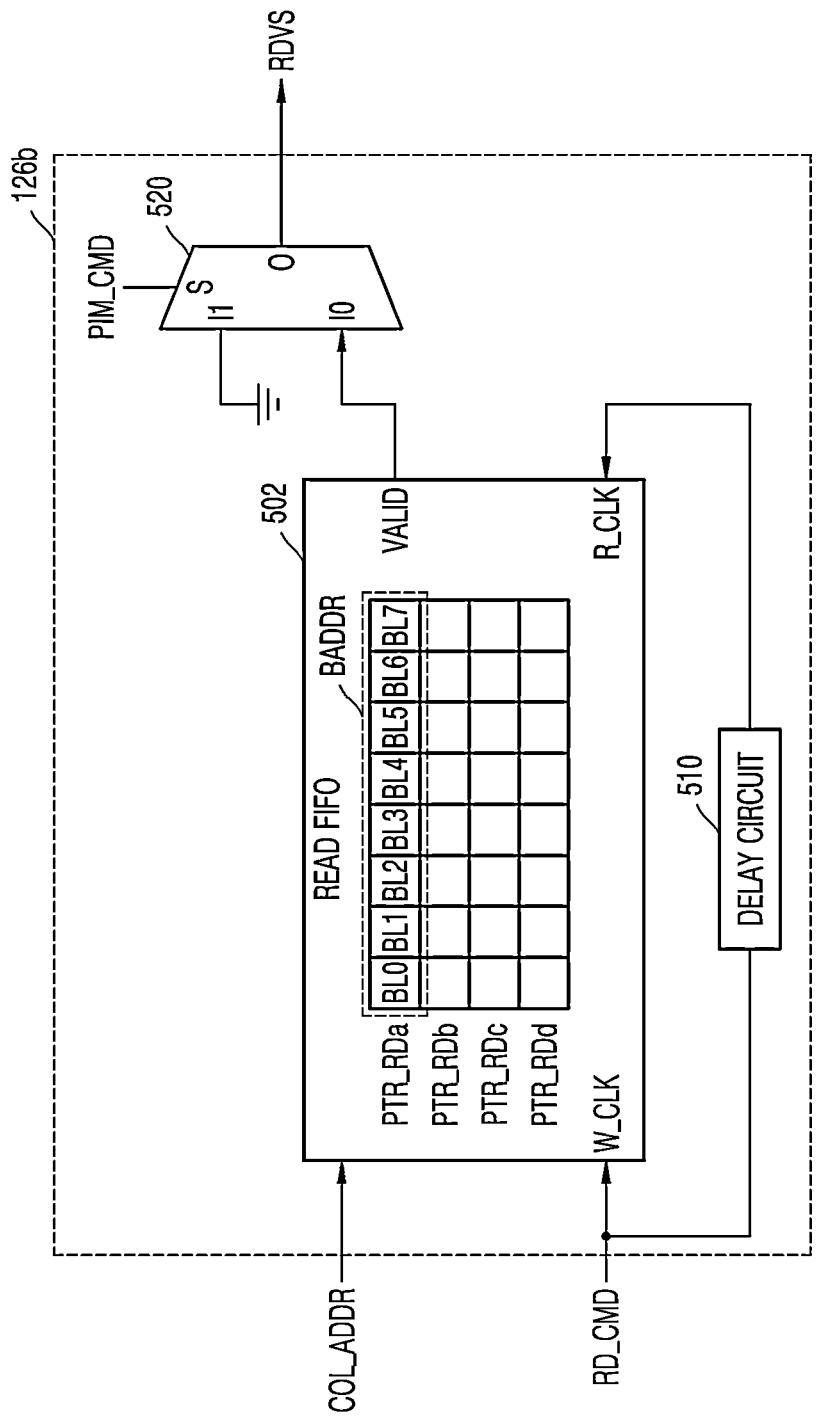

FIGS. 4 and 5 are views each illustrating a control logic circuit controlling an internal processing operation according to an example embodiment of the inventive concepts. FIG. 4 illustrates an example embodiment of implementing a signal transmission path in the internal processing operation related to a write mode of a memory device according to an example embodiment of the inventive concepts and FIG. 5 illustrates an example embodiment of implementing a signal transmission path in the internal processing operation related to a read mode of a memory device. Hereinafter, subscripts (for example, a of 126a, a of WRa, and a of RDa) to the same reference numerals in different drawings are for distinguishing a plurality of circuits having similar functions or the same function from one another.

Referring to FIGS. 3 and 4, a control logic circuit 126a may include a write first in, first out (FIFO) 402 generating a gradually increasing burst address BADDR, based on the column address COL_ADDR provided by the address buffer 310 in a write burst mode and storing the burst address BADDR. The burst address BADDR refers to addresses of column locations that may access the read and/or write commands in relation to the burst length BL.

The write FIFO 402 may be implemented by flip-flops storing the burst address BADDR corresponding to the write command WR_CMD by using write pointers PTR_WRa to PTR_WRd. For example, the burst address BADDR corresponding to the write command WRa_CMD may be stored in the flip-flops of the write pointer PTR_WRa. The burst address BADDR corresponding to the WRb_CMD write command may be stored in the flip-flops of the write pointer PTR_WRb, the burst address BADDR corresponding to the write command WRc_CMD may be stored in the flip-flops of the write pointer PTR_WRc, and the burst address BADDR corresponding to the write command WRd_CMD may be stored in the flip-flops of the write pointer PTR_WRd.

The write FIFO 402 may store the corresponding burst address BADDR in the write pointer PTR_WR corresponding to the write command WR_CMD in response to an input signal W_CLK. The write FIFO 402 may be enabled by the input signal W_CLK to store the corresponding burst address BADDR in the write pointer PTR_WR identified by the write command WR_CMD provided to the input signal W_CLK. The input signal W_CLK may operate as an enable signal of the write FIFO 402 as well as store the burst address BADDR.

The write FIFO 402 may output the burst address BADDR stored in the write pointer PTR_WR in response to an output signal R_CLK. The write FIFO 402 may output the burst address BADDR stored in the write pointer PTR_WR corresponding to the output signal R_CLK. In this case, the output signal R_CLK may receive the write data strobe signal WDQS corresponding to the write command WR_CMD. The write data of the corresponding write command WR_CMD may be received from the memory controller 114 in accordance with the write data strobe signal WDQS.

The control logic circuit 126a may include first to third selectors 410 to 430, and the first to third selectors 410 to 430 may be implemented by multiplexers. The first to third selectors 410 to 430 may change signal transmission paths in the normal mode or in the internal processing mode in response to the PIM command signal PIM_CMD. Each of the first to third selectors 410 to 430 may transmit a signal received by a first input I0 as an output O to output the signal as a motion signal in the normal mode when the PIM command signal PIM_CMD is inactive and may transmit a signal applied to a second input I1 as an output O to output the signal as a motion signal in the internal processing mode when the PIM command signal PIM_CMD is active.

The first selector 410 includes the first input I0 receiving the burst address BADDR output from the write FIFO 402, the second input I1 receiving the column address COL_ADDR provided by the address buffer 310, a selection input S receiving the PIM command signal PIM_CMD, and the output O. The output O of the first selector 410 may be provided as the internal column address CADDR. The first selector 410 may output the burst address BADDR of the first input I0 as the internal column address CADDR when the PIM command signal PIM_CMD is inactive at a logic low level. The first selector 410 may output the column address COL_ADDR of the second input I1 as the internal column address CADDR when the PIM command signal PIM_CMD is active at a logic high level.

In the first selector 410, the column address COL_ADDR may be directly output as the internal column address CADDR without passing through the write FIFO 402 when the received write command WR_CMD refers to the internal processing mode. In the internal processing mode, because the result of the PIM processing operation is written in the memory cell array 3080 related to the column address COL_ADDR, the burst address BADDR related to the memory operation of receiving the write data from the memory controller 114 and writing the received write data in the memory cell array 3080 is not important. That is, when the write command WR_CMD is determined as the internal processing command to the PIM command signal PIM_CMD is activated, the column address COL_ADDR may be directly transmitted to the internal column address CADDR. The internal column address CADDR directly output as the column address COL_ADDR may be generated much earlier than the burst address BADDR output through the write FIFO 402. Therefore, an operation in the internal processing mode, which is performed by the column address COL_ADDR, may be performed faster than an operation in the normal mode, which is performed by the burst address BADDR.

The second selector 420 includes a first input I0 receiving the write command WR_CMD, a second input I1 connected to a ground voltage VSS, a selection input S receiving the PIM command signal PIM_CMD, and an output O. The output O of the second selector 420 may be provided as the input signal W_CLK of the write FIFO 402. The second selector 420 may provide the write command WR_CMD of the first input I0 as the input signal W_CLK of the write FIFO 402 when the PIM command signal PIM_CMD is inactive at the logic row level. The second selector 420 may provide a level of the ground voltage VSS of the second input I1 as the input signal W_CLK of the write FIFO 402 when the PIM command signal PIM_CMD is active at the logic high level.

In the second selector 420, when it is determined that the write command WR_CMD is a normal command and the PIM command signal PIM_CMD is deactivated, the received write command WR_CMD may be transmitted as the input signal W_CLK of the write FIFO 402. At this time, the write FIFO 402 may be enabled by the input signal W_CLK and may store the corresponding burst address BADDR in the write pointer PTR_WR identified by the write command WR_CMD provided as the input signal W_CLK. On the other hand, when it is determined that the write command WR_CMD is an internal processing command so that the PIM command signal PIM_CMD is activated, a logic low level at the ground voltage VSS level is applied as the input signal W_CLK of the write FIFO 402 so that the write FIFO 402 is disabled. At this time, the internal column address CADDR may be output as the column address COL_ADDR by the first selector 410.

The third selector 430 includes a first input I0 receiving the write data strobe signal WDQS, a second input I1 receiving the write command WR_CMD, a selection input S receiving the PIM command signal PIM_CMD, and an output O. The output O of the third selector 430 may be provided as the internal write signal WRS. The third selector 430 may output the strobe signal WDQS of the first input I0 as the internal write signal WRS when the PIM command signal PIM_CMD is inactive at the logic low level. The third selector 430 may output the write command WR_CMD of the second input I1 as the internal write signal WRS when the PIM command signal PIM_CMD is active at the logic high level.

In the third selector 430, when it is determined that the write command WR_CMD is a normal command so that the PIM command signal PIM_CMD is deactivated, the received write data strobe signal WDQS may be transmitted as the internal write signal WRS. The write data strobe signal WDQS may be provided from the memory controller 114 after the write latency WL based on the write command WR_CMD. On the other hand, when it is determined that the write command WR_CMD is an internal processing command so that the PIM command signal PIM_CMD is activated, the write command WR_CMD may be transmitted as the internal write signal WRS. That is, when the write command WR_CMD refers to the internal processing mode, the internal write signal WRS may be generated by the write command WR_CMD. The internal write signal WRS based on the write command WR_CMD may be generated much earlier than the write data strobe signal WDQS. Therefore, an operation in the internal processing mode based on the write command WR_CMD may be performed faster than an operation in the normal mode based on the write data strobe signal WDQS.

Referring to FIGS. 3 and 5, a control logic circuit 126b may include a read FIFO 502 generating a gradually increasing burst address BADDR, based on the column address COL_ADDR provided by the address buffer 310 in the read burst mode and storing the burst address BADDR. The read FIFO 502 may be implemented by flip-flops storing the burst address BADDR corresponding to each of read commands RDa_CMD to RDd_CMD by using each of read pointers PTR_RDa to PTR_RDd. For example, the burst address BADDR corresponding to the read command RDa_CMD may be stored in the flip-flops of the read pointer PTR_RDa. The burst address BADDR corresponding to the write command RDb_CMD may be stored in the flip-flops of the read pointer PTR_RDb, the burst address BADDR corresponding to the read command RDc_CMD may be stored in the flip-flops of the read pointer PTR_RDc, and the burst address BADDR corresponding to the read command RDd_CMD may be stored in the flip-flops of the read pointer PTR_RDd.

The read FIFO 502 may store the corresponding burst address BADDR in the read pointer PTR_RD corresponding to the read command RD_CMD in response to an input signal W_CLK. The read FIFO 502 may output a read valid signal VALID when an operation of storing the corresponding burst address BADDR in the read pointer PTR_RD identified by the read command RD_CMD provided as the input signal W_CLK is completed. The internal read signal RDVS as a main signal of the read operation is generated based on the read valid signal VALID.

The read FIFO 502 may output the burst address BADDR stored in the read pointer PTR_RD in response to the output signal R_CLK. The read FIFO 502 may output the burst address BADDR stored in the read pointer PTR_RD corresponding to the output signal R_CLK. In this case, the output signal R_CLK may receive the read command RD_CMD delayed by a delay circuit 510 by a predetermined time.

The control logic circuit 126b may include a fourth selector 520 implemented by a multiplexer. The fourth selector 520 may change the signal transmission paths in the normal mode or the internal processing mode in response to the PIM command signal PIM_CMD. The fourth selector 520 may transmit a signal received by a first input I0 to an output O to output the signal as a motion signal in the normal mode when the PIM command signal PIM_CMD is inactive and may transmit a signal applied to a second input I1 to the output O to output the signal as a motion signal in the internal processing mode when the PIM command signal PIM_CMD is active.

The fourth selector 520 includes the first input I0 receiving the read valid signal VALID output from the read FIFO 502, the second input It connected to a ground voltage VSS line, a selection input S receiving the PIM command signal PIM_CMD, and the output O. The output O of the fourth selector 520 may be provided as the internal read signal RDVS. The fourth selector 520 may provide the read valid signal VALID of the first input I0 as the internal read signal RDVS when the PIM command signal PIM_CMD is inactive at the logic low level. The fourth selector 520 may provide the ground voltage VSS level of the second input I1 as the internal read signal RDVS when the PIM command signal PIM_CMD is active at the logic high level.

In the fourth selector 520, when the read command RD_CMD is determined as the normal command so that the PIM command signal PIM_CMD is deactivated, the read valid signal VALID may be transmitted as the internal read signal RDVS. The internal read signal RDVS based on the read valid signal VALID may enable the input/output data gating circuit and may control the data read from the memory cell array 3080 to be output to the data input/output line. On the other hand, when the read command RD_CMD refers to the internal processing mode, because the data read from the memory cell array 3080 is used for the processing operation, the read data does not need to be output to the data input/output line. Therefore, an interface operation related to the memory operation of outputting the data read from the memory cell array 3080 to the memory controller 114 is not important.

Figure 6:
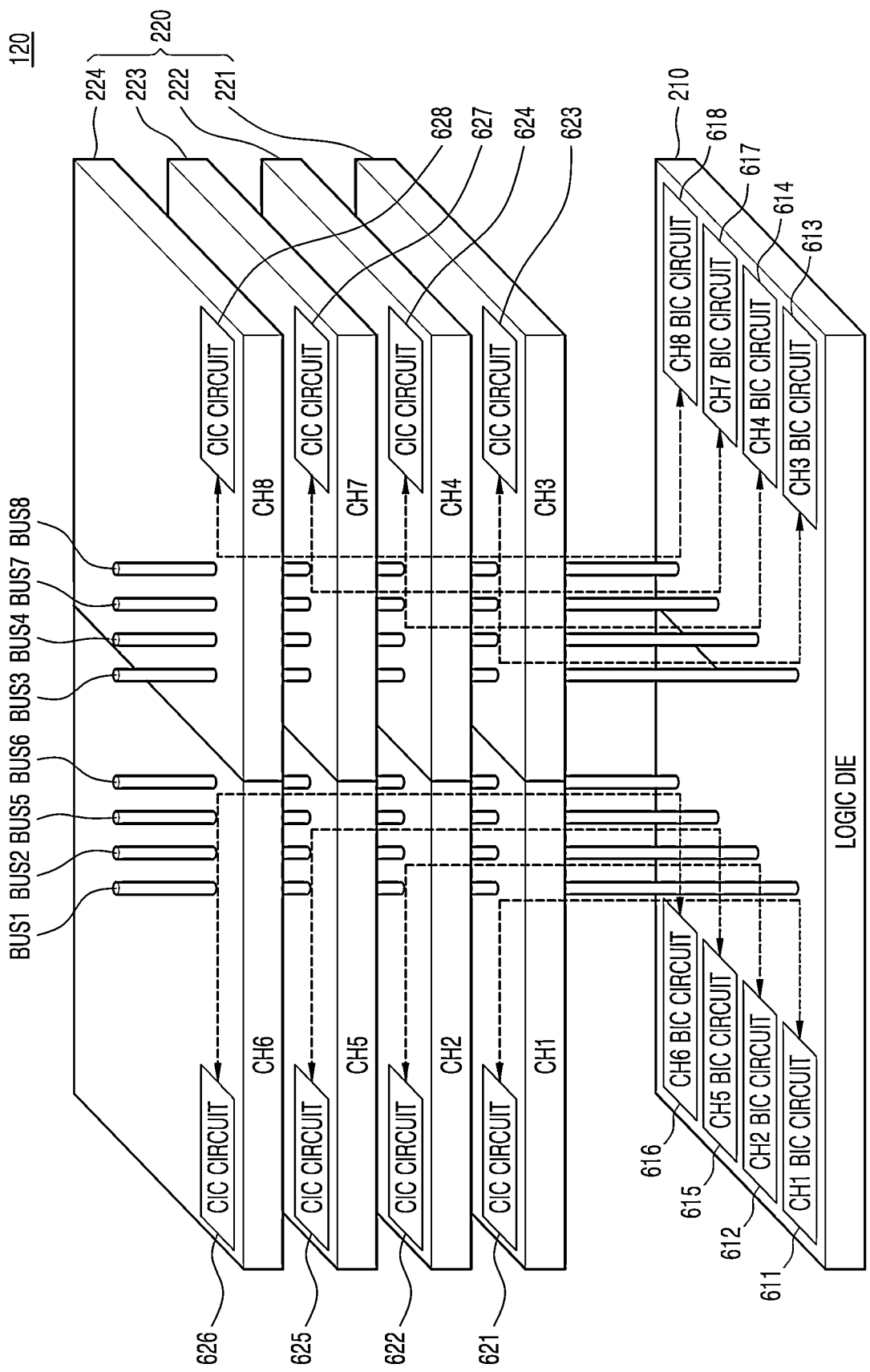
FIGS. 6 and 7 are views each illustrating a data transmission path in a memory device according to an example embodiment of the inventive concepts.
Figure 7:
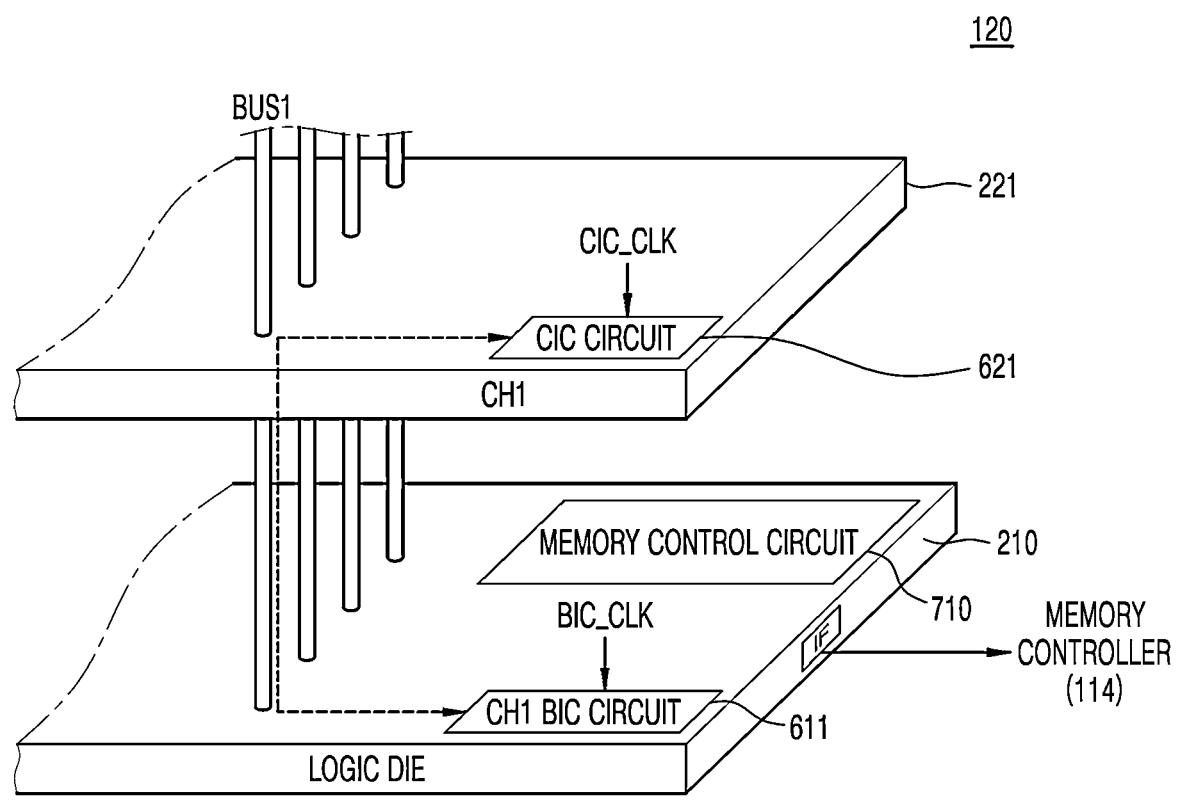

FIGS. 6 and 7 are views each illustrating a data transmission path in a memory device according to an example embodiment of the inventive concepts. FIG. 7 is a view illustrating an example embodiment of implementing a data transmission path between the first channel CH1 of the first core die 221 of FIG. 6 and the logic die 210 of FIG. 6.

Referring to FIGS. 2 and 6, in the memory device 120, data transmission may be performed between the logic die 210 and the first to eighth channels CH1 to CH8 through first to eighth buses BUS1 to BUS8 respectively corresponding to the first to eighth channels CH1 to CH8 of the core dies 220. Each of the first to eighth buses BUS1 to BUS8 may include a plurality of data lines and may longitudinally extend in a vertical direction by connecting the TSVs formed in the stacked core dies to one another.

The logic die 210 and the core dies 220 may include first interconnect circuits 613 to 618 and second interconnect circuits 621 to 628 performing bidirectional communication through the first to eighth buses BUS1 to BUS8 respectively corresponding to the first to eighth channels CH1 to CH8. The first interconnect circuits 613 to 618 and the second interconnect circuits 621 to 628 may include both transmission circuits and receiving circuits.

During a write operation for the first to eighth channels CH1 to CH8, the transmission circuit of the first interconnect circuit 611 of the logic die 210 and the receiving circuit of the second interconnect circuit 621 of the core dies 220 are enabled so that the write data may be transmitted to the first channel CH1 through the corresponding first bus BUS1. Likewise, the transmission circuits of the first interconnect circuits 612 to 618 of the logic die 210 and the receiving circuits of the second interconnect circuits 622 to 628 of the core dies 220 are enabled so that the write data may be transmitted to the second to eighth channels CH2 to CH8 through the second to eighth buses BUS2 to BUS8.

The write operation for each of the first to eighth channels CH1 to CH8 may be independently performed based on the corresponding write command WR_CMD. When the write command WR_CMD is a normal command designating the normal mode, the write data may be transmitted between the first interconnect circuits 613 to 618 and the second interconnect circuits 621 to 628. In the normal mode, the write data transmitted to the second interconnect circuits 621 to 628 may perform a memory operation of writing on in the memory cell array 3080 based on the burst address BADDR corresponding to the write command WR_CMD.

When the write command WR_CMD is a PIM command specifying the internal processing mode, the result of the processing operation performed by the processing element PE may be written in the memory cell array 3080 related to the column address COL_ADDR corresponding to the write command WR_CMD. In the internal processing mode, the result of the processing operation performed by the processing element PE is not transmitted to the first interconnect circuits 613 and 618 and the second interconnect circuits 621 to 628.

In a read operation for each of the first to eighth channels CH1 to CH8, the transmission circuit of the second interconnect circuit 621 of the first channel CH1 and the receiving circuit of the first interconnect circuit 611 of the logic die 210 may be enabled so that the read data may be transmitted to the logic die 210 through the corresponding first bus BUS1. Likewise, the transmission circuits of the second interconnect circuits 622 to 628 of the second to eighth channels CH2 to CH8 and the receiving circuits of the first interconnect circuits 612 to 618 of the logic die 210 are enabled so that the read data may be transmitted to the logic dies 210 through the second to eighth buses BUS2 to BUS8.

The read operation for each of the first to eighth channels CH1 to CH8 may be independently performed based on the corresponding read command RD_CMD. When the read command RD_CMD is a normal command specifying the normal mode, the read data may be transmitted between the second interconnect circuits 621 to 628 and the first interconnect circuits 611 to 618. When the read command RD_CMD is a PIM command specifying the internal processing mode, the read data is not transmitted between the second interconnect circuits 621 to 628 and the first interconnect circuits 611 to 618. That is, because each of the first to eighth channels CH1 to CH8 uses data read from the memory cell array 3080 in the internal processing mode, it is not necessary or desired to transmit the read data to the memory controller 114.

Referring to FIG. 7, in the read operation of the first channel CH1, the second interconnect circuit 621 of the first channel CH1 may be selectively connected to the first interconnect circuit 611 of the logic die 210 through the first bus BUS1. The first interconnect circuit 611 may be selectively enabled in response to a first transmission clock signal BIC_CLK and the second interconnect circuit 621 may be selectively enabled in response to a second transmission clock signal CIC_CLK. The second transmission clock signal CIC_CLK is controlled by the PIM command signal PIM_CMD generated by the first channel CH1. When the PIM command signal PIM_CMD is activated, the second interconnect circuit 621 may be disabled by the second transmission clock signal CIC_CLK. As the second interconnect circuit 621 is disabled, the data read from the memory cell array 3080 is not transmitted to the first bus BUS1.

The logic die 210 may include a memory control circuit 710 controlling the overall operation of the memory device 120. The memory control circuit 710 may determine whether the read command RD_CMD provided to the first channel CH1 represents the internal processing mode. When the read command RD_CMD represents the internal processing mode, the memory control circuit 710 has the first interconnect circuit 611 disabled by the first transmission clock signal BIC_CLK so that connection between the first bus BUS1 and the first interconnect circuit 611 may be blocked.

Figure 8:
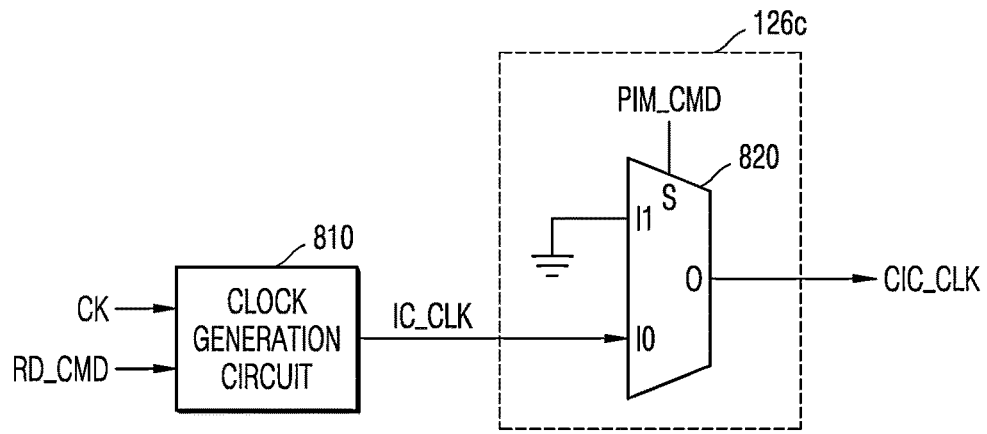
FIGS. 8 and 9 are views each illustrating a signal transmission path in a memory device according to an example embodiment of the inventive concepts.
Figure 9:
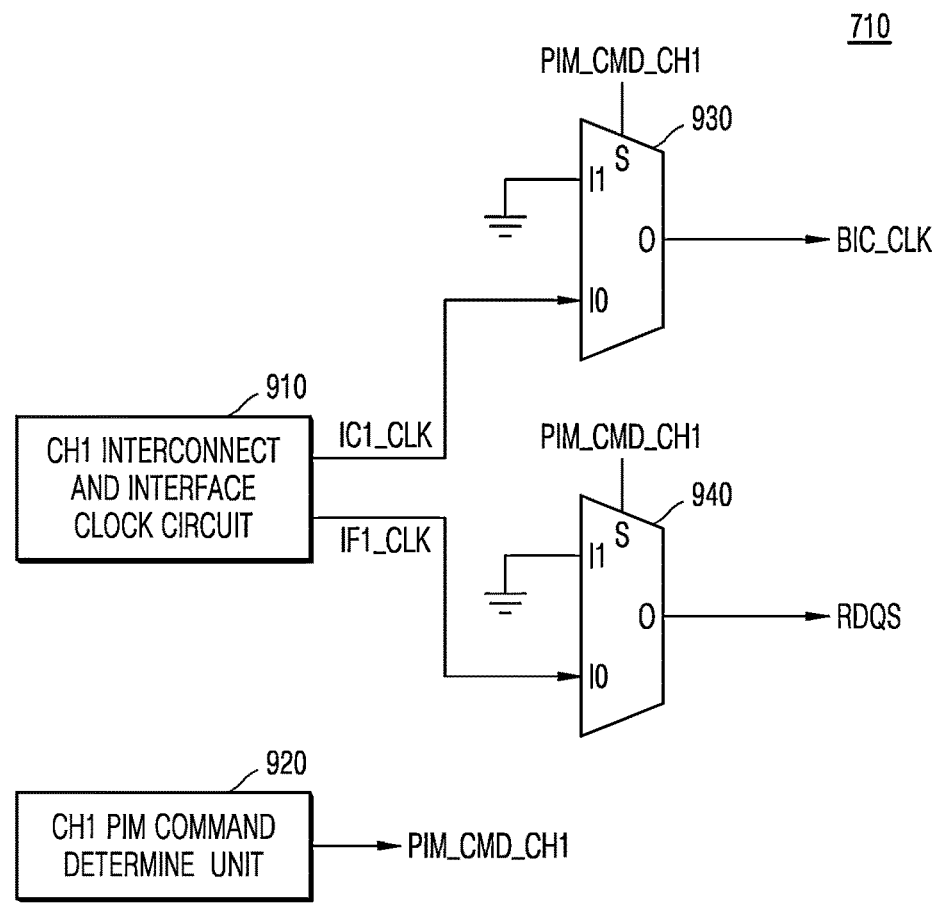

FIGS. 8 and 9 are views each illustrating a signal transmission path in a memory device according to an example embodiment of the inventive concepts. FIG. 8 is a view illustrating an example embodiment of implementing a signal transmission path in an internal processing operation related to a read mode of a memory device according to an example embodiment of the inventive concepts, and FIG. 9 is a view illustrating an example embodiment of the memory control circuit 710 of FIG. 7.

Referring to FIGS. 7 and 8, the control logic circuit 126c of the first channel CH1 may include a fifth selector 820 implemented by a multiplexer. The fifth selector 820 may be connected to a clock generation circuit 810. The clock generation circuit 810 may generate an interconnect clock signal IC_CLK, based on the main clock signal CK and the read command RD_CMD. The interconnect clock signal IC_CLK may operate as a motion signal connecting the second interconnect circuit 621 to the first bus BUS1.

The fifth selector 820 may change the signal transmission paths in the normal mode or the internal processing mode in response to the PIM command signal PIM_CMD. The fifth selector 820 may transmit a signal received by a first input I0 to an output O to output the signal as a motion signal in the normal mode when the PIM command signal PIM_CMD is inactive and may transmit a signal applied to a second input I1 to the output O to output the signal as a motion signal in the internal processing mode when the PIM command signal PIVI_CMD is active.

The fifth selector 820 includes the first input I0 receiving the interconnect clock signal IC_CLK provided by the clock generation circuit 810, the second input I1 connected to a ground voltage VSS line, a selection input S receiving the PIM command signal PIM_CMD, and the output O. The output O of the fifth selector 820 may be provided as the second transmission clock signal CIC_CLK. When the PIM command signal PIM_CMD is inactive at the logic low level, the fifth selector 820 may provide the interconnect clock signal IC_CLK of the first input I0 as the second transmission clock signal CIC_CLK. When the PIM command signal PIM_CMD is active at the logic high level, the fifth selector 820 may provide the logic low level of the ground voltage VSS level of the second input 11 to the second transmission clock signal CIC_CLK.

In the fifth selector 820, when the read command RD_CMD is determined as a normal command so that the PIM command signal PIM_CMD is deactivated, the interconnect clock signal IC_CLK may be transmitted as the second transmission clock signal CIC_CLK. The second transmission clock signal CIC_CLK based on the interconnect clock signal IC_CLK may enable the second interconnect circuit 621 and may control the data read from the memory cell array 3080 to be transmitted to the first bus BUS1. On the other hand, when the read command RD_CMD refers to the internal processing mode, because the data read from the memory cell array 3080 is used for the processing operation, it is not necessary or desired to output the read data to the first bus BUS1. Therefore, the second interconnect circuit 621 is disabled by the second transmission clock signal CIC_CLK at a logic low level so that the data read from the memory cell array 3080 is not transmitted to the first bus BUS1. In this case, power consumption of the memory device 120 may be reduced in comparison with that of the memory device 120 when the second interconnect circuit 621 is enabled to transmit the read data.

Referring to FIGS. 7 and 9, the memory control circuit 710 may include an interconnect and interface clock circuit 910 for the first channel CH1, a PIM command determination unit 920 for the first channel CH1, and first and second selectors 930 and 940 implemented by multiplexers. The interconnect and interface clock circuit 910 may output an interconnect clock signal IC1_CLK and an interface clock signal IF1_CLK related to the first channel CH1. The interconnect clock signal IC1_CLK may operate as a motion signal connecting the first interconnect circuit 611 to the first bus BUS1. The interface clock signal IF1_CLK may operate as a source signal of the read data strobe signal RDQS of the first channel CH1 provided to the interface circuit 211.

The PIM command determination unit 920 may determine whether the read command RD_CMD provided from the memory controller 114 to the first channel CH1 through the interface circuit 211 indicates the internal processing mode. When the read command RD_CMD indicates the internal processing mode, the PIM command determination unit 920 may generate a first channel PIM command signal PIM_CMD_CH1.

The first selector 930 includes a first input I0 receiving the interconnect clock signal IC1_CLK provided by the interconnect and interface clock circuit 910, a second input I1 connected to a ground voltage VSS line, a selection input S receiving the first channel PIM command signal PIM_CMD_CH1, and an output O. The output O of the first selector 930 may be provided as a first transmission clock signal BIC_CLK. When the first channel PIM command signal PIM_CMD_CH1 is inactive at a logic low level, the first selector 930 may provide the interconnect clock signal IC1_CLK of the first input I0 as the first transmission clock signal BIC_CLK. When the first channel PIM command signal PIM_CMD_CH1 is active at a logic high level, the first selector 930 may provide the logic low level of the ground voltage VSS level of the second input I1 as the first transmission clock signal BIC_CLK.

In the first selector 930, when the read command RD_CMD provided to the first channel CH1 is determined as a normal mode so that the first channel PIM command signal PIM_CMD_CH1 is deactivated, the interconnect clock signal IC1_CLK may be transmitted as the first transmission clock signal BIC_CLK. The first transmission clock signal BIC_CLK based on the interconnect clock signal IC1_CLK may enable the first interconnect circuit 611 and may perform control so that the data output from the first channel CH1 is received through the first bus BUS1. On the other hand, when the read command RD_CMD provided to the first channel CH1 refers to the internal processing mode, because the data read from the memory cell array 3080 of the first channel CH1 is used for the processing operation, the second interconnect circuit 621 of the first channel CH1 is disabled so that the read data of the first channel CH1 is not output to the first bus BUS1. Therefore, the first interconnect circuit 611 is disabled by the first transmission clock signal BIC_CLK at the logic low level so that connection with the first bus BUS1 and the first interconnect circuit 611 is blocked. In this case, power consumption of the memory device 120 may be reduced in comparison with that of the memory device 120 when the first interconnect circuit 611 is enabled to transmit the read data.

The second selector 940 includes a first input I0 receiving the interface clock signal IF1_CLK provided by the interconnect and interface clock circuit 910, a second input I1 connected to a ground voltage VSS line, a selection input S receiving the first channel PIM command signal PIM_CMD_CH1, and an output O. The output O of the second selector 940 may be provided as the read data strobe signal RDQS for the first channel CH1. The read data strobe signal RDQS may be provided to the memory controller 114 with the read data of the first channel CH1. When the first channel PIM command signal PIM_CMD_CH1 is inactive at the logic low level, the second selector 940 may provide the interface clock signal IF1_CLK of the first input I0 as the read data strobe signal RDQS. When the first channel PIM command signal PIM_CMD_CH1 is active at the logic high level, the second selector 940 may provide the logic low level at the ground voltage VSS level of the second input I1 as the read data strobe signal RDQS.

In the second selector 940, when the read command RD_CMD provided to the first channel CH1 is determined as a normal mode so that the first channel PIM command signal PIM_CMD_CH1 is deactivated, the interface clock signal IF1_CLK may be transmitted as the read data strobe signal RDQS. The read data strobe signal RDQS based on the interface clock signal IF1_CLK toggles and is controlled to be transmitted to the memory controller 114 through the interface circuit 211 with the read data. On the other hand, when the read command RD_CMD provided to the first channel CH1 refers to the internal processing mode, because the data read from the memory cell array 3080 of the first channel CH1 is used for the processing operation and the second interconnect circuit 621 of the first channel CH1 is disabled so that the read data of the first channel CH1 is not provided to the first bus BUS1, the read data strobe signal RDQS may be output at a logic low level. In this case, power consumption of the memory device 120 may be reduced in comparison with that of the memory device 120 when the read data strobe signal RDQS toggles with the read data.

Figure 10A:
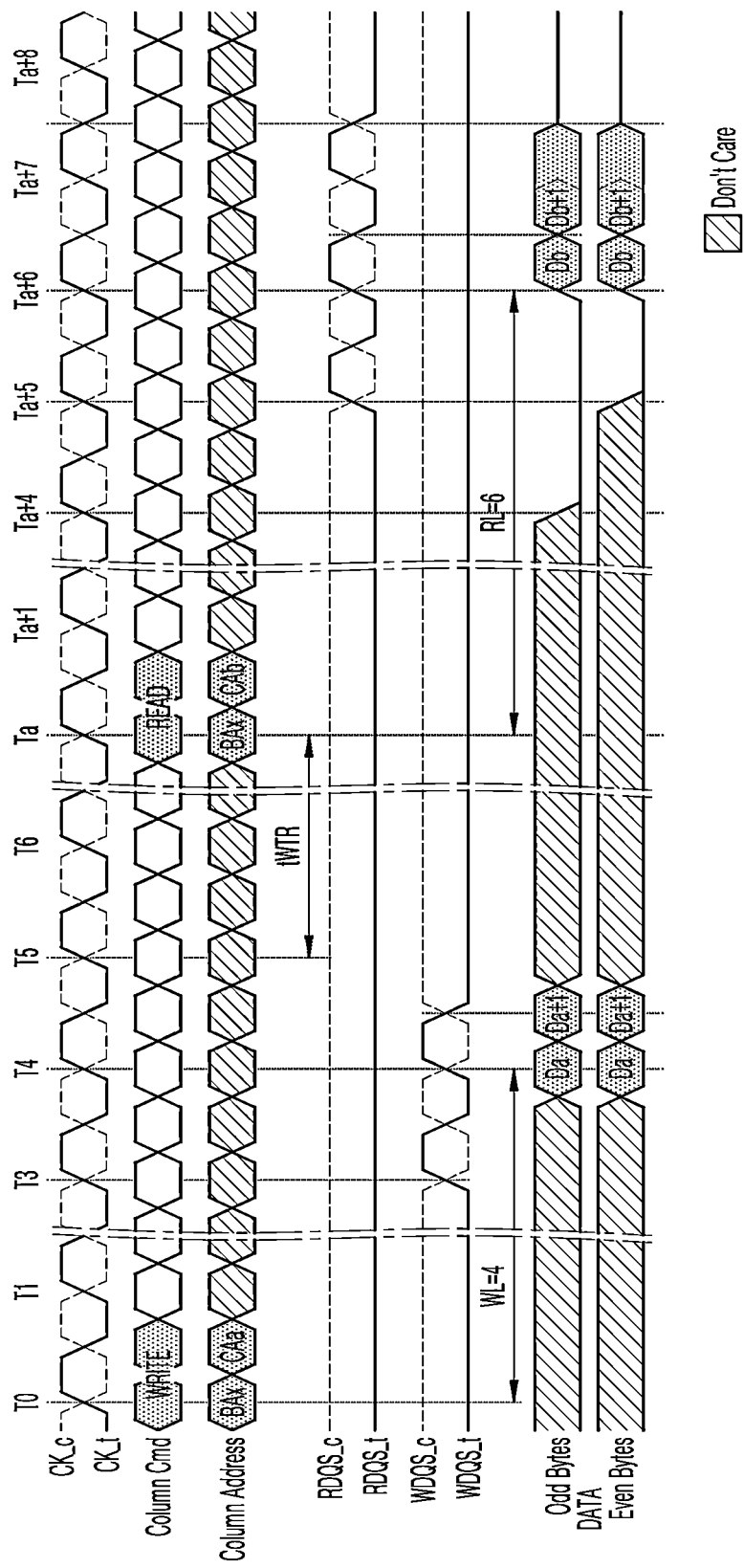
FIGS. 10A and 10B are timing diagrams each illustrating a write operation of a memory device according to an example embodiment of the inventive concepts.
Figure 10B:
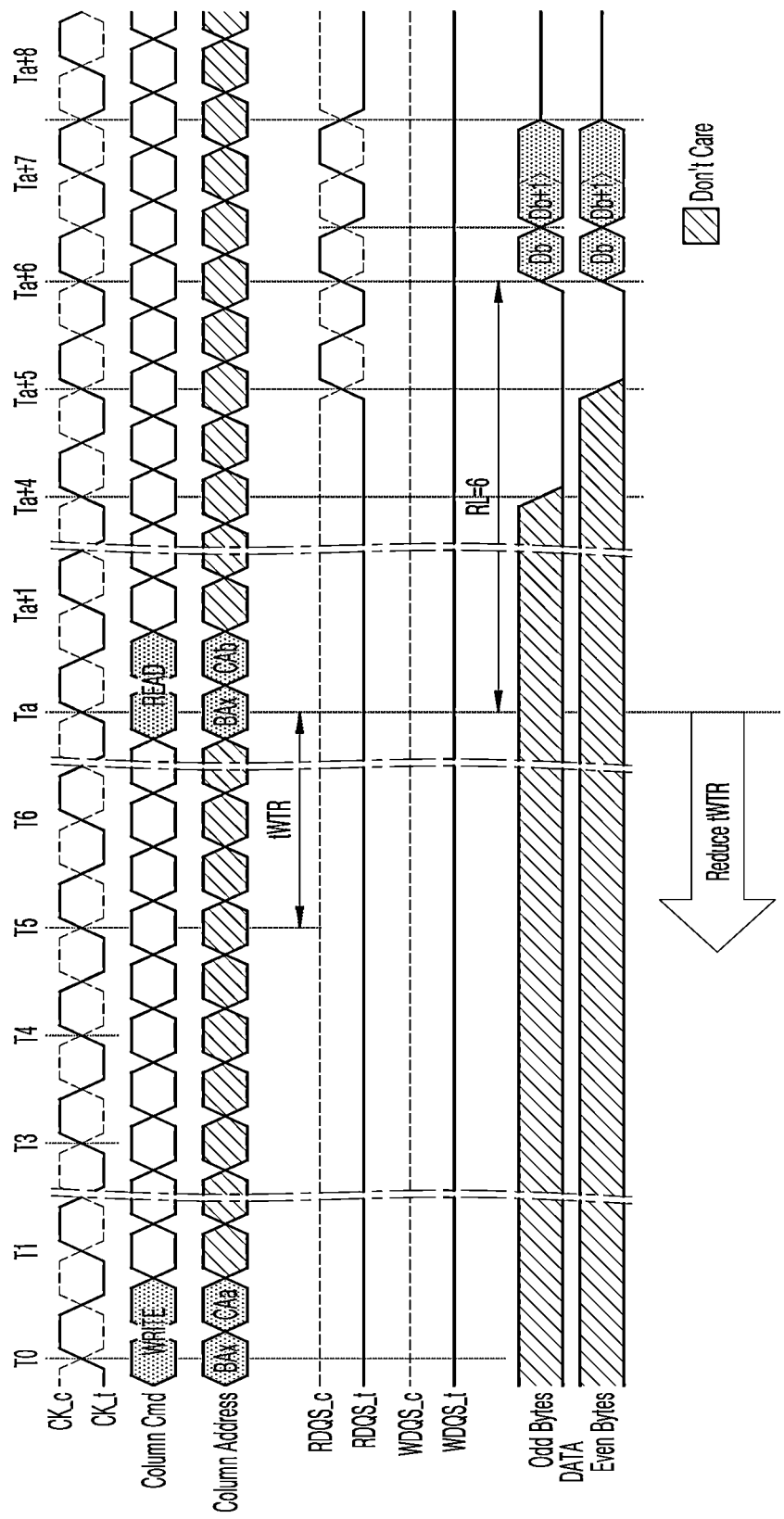

FIGS. 10A and 10B are timing diagrams each illustrating a write operation of a memory device according to an example embodiment of the inventive concepts. FIG. 10A is a timing diagram illustrating the write operation of the memory device when the write command of the memory device refers to the normal mode and FIG. 10B is a timing diagram illustrating the write operation of the memory device when the write command of the memory device refers to the internal processing mode. The timing diagrams according to the inventive concepts are not necessarily illustrated at a constant rate.

Referring to FIG. 10A in connection with FIGS. 1 to 9, at time t0, a write command WRITE in the normal mode may be applied to the memory device 120. Bank and column addresses BAx and CAa may be received with the write command WRITE. After the write latency WL from time t0, for example, at time T4 of WL=4, write data DATA may be received. Time between time t0 to time T4 corresponds to preparation time for the memory operation of writing the write data DATA to be received in synchronization with the write data strobe signal WDQS in the memory cell array 3080 based on the bank and column addresses BAx and CAa. During this time, the write FIFO 402 described in FIG. 4 may store the corresponding burst address BADDR in the write pointer PTR_WR corresponding to the write command WRITE. From time T4, the write operation of writing the write data DATA in the memory cells of the memory cell array 3080 related to the burst address BADDR output from the write FIFO 402.

After the write operation of the memory device 120, a read command READ may be applied at time Ta. The read command READ applied after the write operation is to be applied at time satisfying the tWTR parameter. The tWTR parameter may be provided in order to ensure the final write data DATA to be written in the memory cell array 3080. The tWTR parameter may satisfy tWTR timing requirements specified in the DDR and/or LPDDR specifications of the JEDEC standard. After the read latency RL from time Ta, for example, at time Ta+7 of RL=6, read data DATA may be output.

Referring to FIG. 10B, at time t0, the bank and column addresses BAx and CAa may be applied to the memory device 120 with the write command WRITE in the internal processing mode. In the internal processing mode, the memory device 120 writes the result of the processing operation performed by the processing element PE, that is, internal data in the memory cell array 3080 related to the bank and column addresses BAx and CAa corresponding to the write command WRITE. Therefore, time for which the write operation in the internal processing mode is performed may be smaller than time for which the write operation in the normal mode is performed. In the internal processing mode, because the write data, that is, external data is not received from the memory controller 114, the pair of write data strobe signals WDQS_t and WDQS_c related to the write data specified in the normal mode may be non-set by the memory device 120 so as not to toggle. In addition, in the internal processing mode, because the memory operation of writing the external write data in the memory cell array 3080 is not performed, the tWTR parameter specified in the normal mode may be reduced.

Figure 11B:
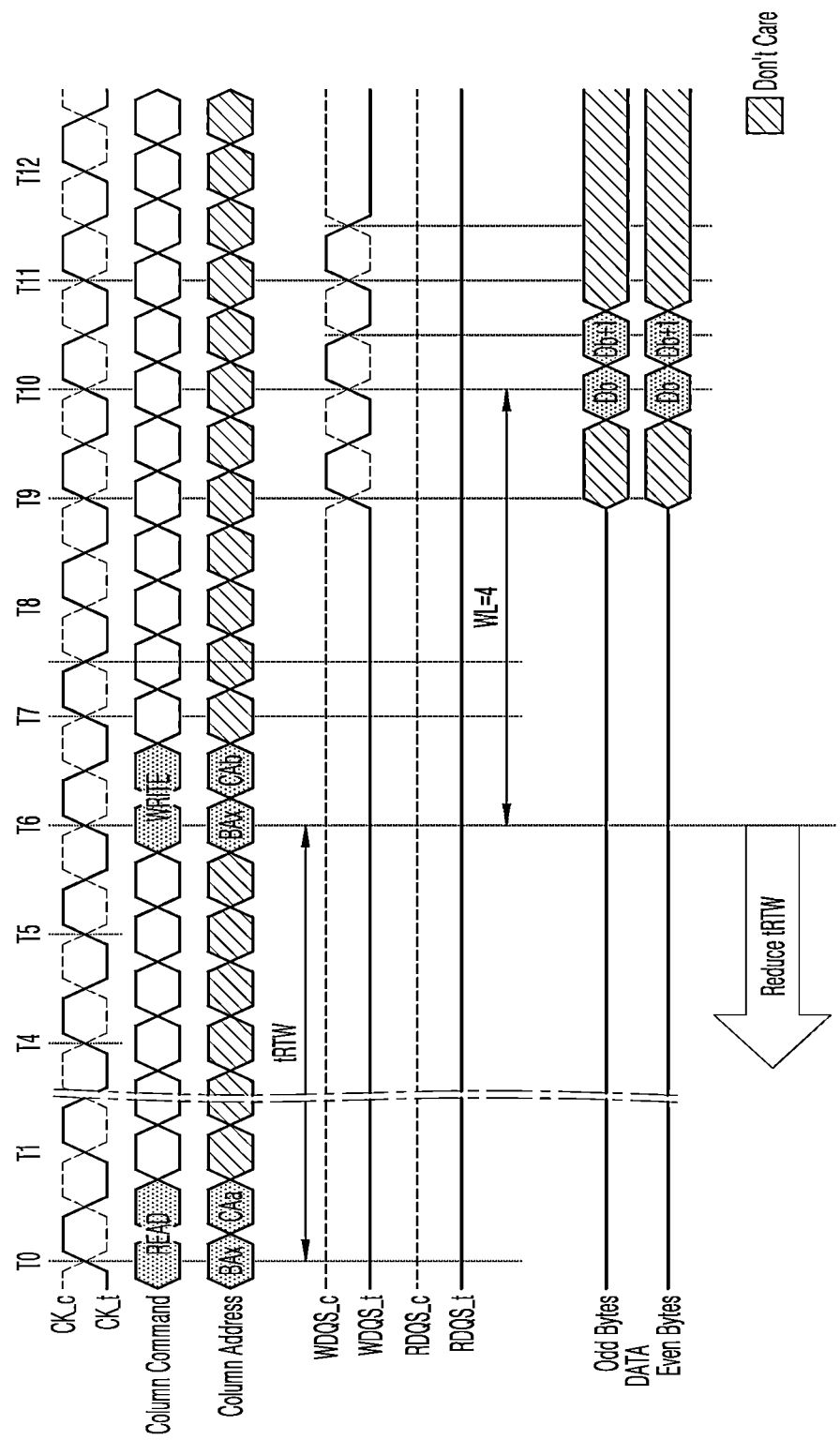

FIGS. 11A and 11B are timing diagrams each illustrating a read operation of a memory device according to an example embodiment of the inventive concepts. FIG. 11A is a timing diagram illustrating the read operation of the memory device when the read command of the memory device refers to the normal mode and FIG. 11B is a timing diagram illustrating the read operation of the memory device when the read command of the memory device refers to the internal processing mode.

Referring to FIG. 11A in connection with FIGS. 1 to 9, at time t0, the bank and column addresses BAx and CAa may be applied to the memory device 120 with a read command READ in the normal mode. After the read latency RL time t0, for example, at time T6 of RL32 6, read data DATA may be output. Time between time t0 to time T6 corresponds to preparation time for the memory operation of reading the read data DATA to be output in synchronization with the read data strobe signal WDQS from the memory cell array 3080 based on the bank and column addresses BAx and CAa. During this time, the read FIFO 502 described in FIG. 5 may store the corresponding burst address BADDR in the read pointer PTR_RD corresponding to the read command READ. From time T6, an operation of reading the data stored in the memory cells of the memory cell array 3080 connected to the burst address BADDR output from the read FIFO 502 may be performed.

The write command WRITE applied after the read operation is to be applied at time satisfying the tRTW parameter. The tRTW parameter may be provided in order to ensure the final read data DATA of the memory cell array 3080 to be output. At time T6, the bank and column addresses BAx and CAa may be received with the write command WRITE. After the write latency WL from time T6, for example, at time T10 of WL=4, the write data DATA may be received.

Referring to FIG. 11B, at time t0, the bank and column addresses BAx and CAa may be applied to the memory device 120 with the read command READ in the internal processing mode. The data read from the memory cell array 3080 based on the bank and column addresses BAx and CAa is used for the processing operation. As illustrated in FIGS. 6 to 8, because the read data of the memory device 120 is not transmitted to the memory controller 114, the pair of read data strobe signals RDQS_t and RDQS_c are not transmitted.

In the internal processing mode, setting may be performed so that the read data is used regardless of the read latency RL related to the operation of reading the data of the memory cell array 3080 and transmitting the read data to the memory controller 114. Therefore, in the internal processing mode, the pair of read data strobe signals RDQS_t and RDQS_c related to the read data specified in the normal mode may be non-set so as not to toggle. In addition, in the internal processing mode, because the read data is not transmitted to the memory controller 114, the tRTW parameter specified in the normal mode may be reduced.

Figure 12:
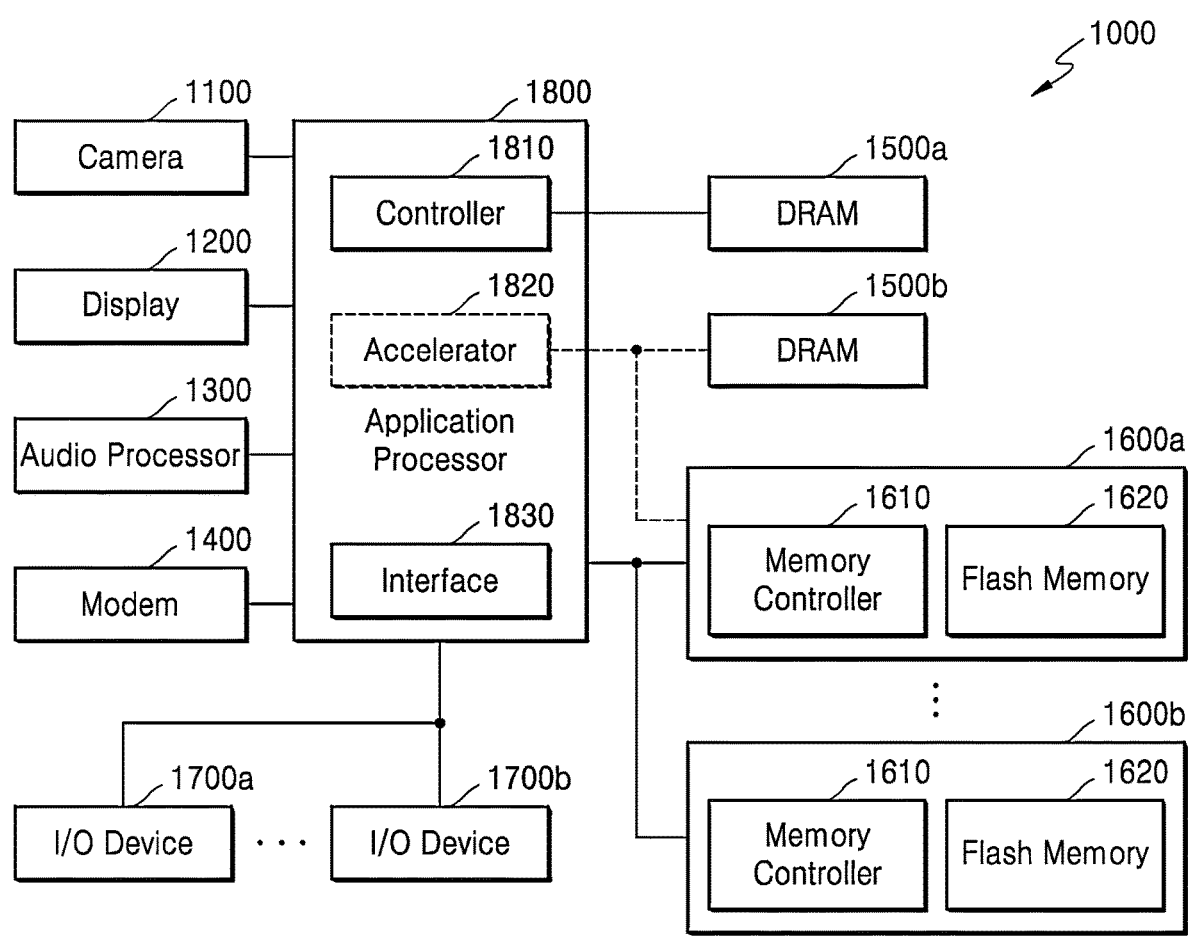
FIG. 12 is a block diagram illustrating a system including a memory device according to an example embodiment of the inventive concepts.

FIG. 12 is a block diagram illustrating a system 1000 including a memory device according to an example embodiment of the inventive concepts.

Referring to FIG. 12, the system 1000 may include a camera 1100, a display 1200, an audio processor 1300, a modem 1400, DRAM devices 1500a and 1500b, flash memory devices 1600a and 1600b, input/output (I/O) devices 1700a and 1700b, and an application processor (hereinafter, referred to as "AP") 1800. The system 1000 may be implemented by a laptop computer, a mobile phone, a smartphone, a tablet personal computer (PC), a wearable device, a healthcare device, or an Internet of things (IOT) device. In addition, the system 1000 may be implemented by a server or a PC.

The camera 1100 may capture a still image or a moving picture in accordance with control of a user and may store the captured image/image data or may transmit the captured image/image data to the display 1200. The audio processor 1300 may process audio data included in the flash memory devices 1600a and 1600b or contents of a network. The modem 1400 may modulate and transmit a signal in order to transmit and receive wired/wireless data and may demodulate the modulated signal in order to recover the modulated signal to an original signal in a receiving side. The I/O devices 1700a and 1700b may include devices providing digital input and/or output functions such as a universal serial bus (USB) or a storage, a digital camera, a secure digital (SD) card, a digital versatile disc (DVD), a network adapter, and a touch screen.

The AP 1800 may control an overall operation of the system 1000. The AP 1800 may control the display 1200 so that some of the contents stored in the flash memory devices 1600a and 1600b are displayed on the display 1200. When a user input is received through the I/O devices 1700a and 1700b, the AP 1800 may perform a control operation corresponding to the user input. The AP 1800 may include an accelerator block that is a dedicated circuit for data operation or an accelerator chip 1820 apart from the AP 1800. The DRAM device 1500b may be additionally mounted in the accelerator block or the accelerator chip 1820. The accelerator block as a function block professionally performing a specific function of the AP 1800 may include the GPU as a function block professionally performing graphics data processing, a neural processing unit (NPU) as a block professionally performing AI calculation and inference, and a data processing unit (DPU) as a block professionally performing data transmission.

The system 1000 may include the DRAM devices 1500a and 1500b. The AP 1800 may control the DRAM devices 1500a and 1500b by setting a command and a mode register MRS suitable for the JEDEC standard or may perform communication by setting a DRAM interface code in order to use company-specific functions such as a low voltage/a high speed/reliability and cyclic redundancy check (CRC)/error correction code (ECC) functions. For example, the AP 1800 may communicate with the DRAM device 1500a by an interface suitable for the JEDEC standard such as LPDDR4 or LPDDR5 and the accelerator block or the accelerator chip 1820 may perform communication by setting a new DRAM interface code in order to control the DRAM device 1500b for an accelerator having a higher bandwidth than that of the DRAM device 1500a.

In FIG. 12, only the DRAM devices 1500a and 1500b are illustrated. However, the inventive concepts are not limited thereto and any memory such as phase-change RAM (PRAM), SRAM, magneto-resistive RAM (MRAM), resistive RAM (RRAM), ferroelectric RAM (FRAM), or hybrid RAM may be used if only a bandwidth, a reaction speed, and voltage conditions of the AP 1800 or the accelerator chip 1820 are satisfied. The DRAM devices 1500a and 1500b have latencies and bandwidths lower than those of the I/O devices 1700a and 1700b or the flash memory devices 1600a and 1600b. The DRAM devices 1500a and 1500b may be initialized at a power on of the system 1000 and may have the OS and application data loaded thereon so as to be used as an arbitrary storage of the OS and the application data or an execution space of various software codes.

In the DRAM devices 1500a and 1500b, addition/subtraction/multiplication/division, a vector operation, an address operation, or a fast Fourier transform (FFT) operation may be performed. In addition, in the DRAM devices 1500a and 1500b, a function used for inference may be performed. Here, the inference may be performed in a deep learning algorithm using an artificial neural network. The deep learning algorithm may include training operation of learning a model through various data items and inference operation of recognizing data by the learned model. In an example embodiment, the image captured by a user through the camera 1100 may be signal processed and stored in the DRAM device 1500b and the accelerator block or the accelerator chip 1820 may perform the AI data operation of recognizing data by using the data stored in the DRAM device 1500b and the function used for the inference.

The system 1000 may include a plurality of storages or the flash memory devices 1600a and 1600b having capacity greater than that of the DRAM devices 1500a and 1500b. The accelerator block or the accelerator chip 1820 may perform training operation and inference AI data operation by using the flash memory devices 1600a and 1600b. For example, the flash memory devices 1600a and 1600b may efficiently perform the training operation and the inference AI data operation performed by the AP 1800 and/or the accelerator chip 1820 by using an operation device included in a memory controller 1610. The flash memory devices 1600a and 1600b may store a photograph taken by the camera 1100 or data received through a data network. For example, the flash memory devices 1600a and 1600b may store augmented reality (AR)/virtual reality (VR) and high definition (HD) or ultrahigh definition (UHD) contents.

In the system 1000, the DRAM devices 1500a and 1500b may include a control logic circuit controlling the normal mode and the internal processing mode and a PIM circuit performing the processing operation in the internal processing mode. The pair of write data strobe signals WDQS_t and WDQS_c may be non-set by the DRAM devices 1500a and 1500b so as not to toggle in the internal processing mode. The pair of read data strobe signals RDQS_t and RDQS_c may be non-set by the DRAM devices 1500a and 1500b so as not to toggle in the internal processing mode. The DRAM devices 1500a and 1500b may set the first timing parameter (for example, the tWTR parameter) as the operating condition for the read command received after the write operation based on the write command and may set the first timing parameter in the internal processing mode to be shorter than that in the normal mode. The DRAM devices 1500a and 1500b may set the second timing parameter (for example, the tRTW parameter) as the operating condition for the write command received after the read operation based on the read command and may set the second timing parameter in the internal processing mode to be shorter than that in the normal mode.

Additionally, the processor 112, the memory controller 114, the PM circuit 122, the control logic circuit 126, the PIM command determine circuit 124, the controller 1810, the accelerator 1820, the memory controllers 1610 and/or the components included therein may include processor(s) and/or processing circuitry such as hardware including logic circuits; a hardware/software combination such as a processor executing software; or a combination thereof. For example, the processor(s) and/or processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concepts have been particularly shown and described with reference to example embodiments thereof, it will be understood that various changes in form and details may be made therein without departing from the spirit and scope of the following claims.

What is claimed is:
1. A memory device comprising:
a memory cell array including a plurality of memory cells;
a processing-in-memory (PIM) circuit configured to perform a processing operation; and
a control logic circuit configured,
in response to a write command in a normal mode received from a memory controller to the memory device, to control the memory device to perform a write operation for write data provided by the memory controller,
in response to the write command in an internal processing mode received from the memory controller to the memory device, to control the memory device to perform a write operation for an operation result obtained by the processing operation,
to control the memory device so that a first time for the write operation in the internal processing mode being performed is less than a second time for the write operation in the normal mode being performed, and to non-set a write data strobe signal related to the write operation in the internal processing mode so as not to toggle the write data strobe signal during the write operation of the operation result in the internal processing mode.

2. The memory device of claim 1, wherein the control logic circuit is configured to receive the write data related to a write latency from the memory controller in the normal mode and not receive the write data from the memory controller in the internal processing mode.

3. The memory device of claim 1, wherein the control logic circuit is configured to set a first timing parameter as an operating condition for a read command received after the write operation based on the write command, and the control logic circuit is further configured to set the first timing parameter in the internal processing mode to be shorter than the first timing parameter in the normal mode.

4. The memory device of claim 3, wherein the first timing parameter includes a write-to-read delay (tWTR) parameter determined in a standard of the memory device.

5. A memory device comprising:

a memory cell array including a plurality of memory cells;

a processing-in-memory (PIM) circuit configured to perform a processing operation; and a control logic circuit configured, in response to a write command in a normal mode received from a memory controller to the memory device, to control the memory device to perform a write operation for write data provided by the memory controller, in response to the write command in an internal processing mode received from the memory controller to the memory device, to control the memory device to perform a write operation for an operation result obtained by the processing operation, and to control the memory device so that a first time for the write operation in the internal processing mode being performed is less than a second time for the write operation in the normal mode being performed, wherein the control logic circuit comprises a PIM command determination unit configured to determine whether the write command specifies the internal processing mode and to generate a PIM command signal, a write register configured to generate and store a burst address based on a column address received with the write command, and a first selector configured to transmit the column address as an internal column address in response to the PIM command signal being active and to transmit the burst address stored in the write register as the internal column address in response to the PIM command signal being inactive, wherein the write operation is performed based on the internal column address.

6. The memory device of claim 5, wherein the control logic circuit further comprises a second selector configured to disable the write register in response to the PIM command signal being active, and provide the write command to the write register in response to the PIM command signal being inactive to enable the write register.

7. The memory device of claim 5, wherein the control logic circuit further comprises a third selector configured to transmit a write data strobe signal received from an outside of the memory device as an internal write signal in response to the PIM command signal being inactive and to transmit the write command as the internal write signal in response to the PIM command signal being active, wherein the write operation is performed based on the internal write signal.

8. The memory device of claim 7, wherein the write register is configured to provide the burst address to the first selector in response to the write data strobe signal.

9. A memory device comprising:

at least one logic die;

a plurality of memory dies stacked on the at least one logic die; and through silicon vias (TSV) configuring buses electrically connecting the at least one logic die to the plurality of memory dies, wherein each of the plurality of memory dies comprises a memory cell array including a plurality of memory cells, a processing-in-memory (PIM) circuit configured to perform a processing operation, and a control logic circuit configured to in response to a write command in a normal mode received from a memory controller to the memory device, control each of the plurality of memory dies to perform a write operation for write data provided by the memory controller, in response to the write command in an internal processing mode received from the memory controller to the memory device, control each of the plurality of memory dies to perform a write operation for an operation result obtained by the processing operation, and control the memory device so that a first time for the write operation in the internal processing mode being performed is less than a second time for the write operation in the normal mode being performed, and wherein the control logic circuit comprises a selector configured to transmit a write data strobe signal received from outside of the memory device as an internal write signal in response to a PIM command signal being inactive, and transmit the write command as the internal write signal in response to the PIM command signal being active, wherein the write operation is performed based on the internal write signal.

10. The memory device of claim 9, wherein the control logic circuit is configured to receive the write data related to a write latency from the memory controller in the normal mode and not receive the write data from the memory controller in the internal processing mode.

11. The memory device of claim 10, wherein the control logic circuit is configured to receive the write data from the memory controller with a write data strobe signal in the normal mode and not receive the write data strobe signal from the memory controller in the internal processing mode.

12. The memory device of claim 9, wherein the control logic circuit is configured to set a first timing parameter as an operating condition for a read command received after the write operation based on the write command, and the control logic circuit is further configured to set the first timing parameter in the internal processing mode to be shorter than that in the normal mode.

13. The memory device of claim 12, wherein the first timing parameter includes a write-to-read delay (tWTR) parameter determined in a standard of the memory device.

\* \* \* \* \*